(12) United States Patent
Mun et al.

(10) Patent No.: US 9,873,815 B2
(45) Date of Patent: Jan. 23, 2018

(54) POLYMER, ORGANIC LAYER COMPOSITION, AND METHOD OF FORMING PATTERNS

(71) Applicant: SAMSUNG SDI CO., LTD., Yongin-si, Gyeonggi-do (KR)

(72) Inventors: Soohyoun Mun, Suwon-si (KR); Hyo Young Kwon, Suwon-si (KR); Ran Namgung, Suwon-si (KR); Younhee Nam, Suwon-si (KR); Hyunji Song, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/062,233

(22) Filed: Mar. 7, 2016

(65) Prior Publication Data
US 2016/0322216 A1    Nov. 3, 2016

(30) Foreign Application Priority Data

Apr. 30, 2015   (KR) .................. 10-2015-0062055
Sep. 22, 2015   (KR) .................. 10-2015-0133998

(51) Int. Cl.
| | | |
|---|---|---|
| G03F 7/09 | (2006.01) | |
| G03F 7/11 | (2006.01) | |
| C09D 161/26 | (2006.01) | |
| C09D 161/06 | (2006.01) | |
| C08G 8/04 | (2006.01) | |
| C08G 12/26 | (2006.01) | |
| C08G 73/06 | (2006.01) | |
| H01L 21/033 | (2006.01) | |
| G03F 7/075 | (2006.01) | |

(52) U.S. Cl.
CPC .......... *C09D 161/06* (2013.01); *C08G 8/04* (2013.01); *C08G 12/26* (2013.01); *C08G 73/0672* (2013.01); *C09D 161/26* (2013.01); *G03F 7/0752* (2013.01); *G03F 7/091* (2013.01); *G03F 7/094* (2013.01); *H01L 21/0332* (2013.01)

(58) Field of Classification Search
None
See application file for complete search history.

(56) References Cited

U.S. PATENT DOCUMENTS

| | | | | |
|---|---|---|---|---|
| 6,597,012 B2 * | 7/2003 | Kido | .............. | H01L 51/0035 257/30 |
| 8,217,181 B2 * | 7/2012 | Wang | .............. | C07D 487/04 548/418 |
| 8,911,921 B2 | 12/2014 | Matsumoto et al. | | |
| 2006/0142520 A1 * | 6/2006 | Jones | .............. | C08F 212/14 526/328.5 |
| 2008/0145705 A1 * | 6/2008 | Narihiro | .............. | C09K 11/06 428/704 |
| 2009/0056811 A1 * | 3/2009 | Noguchi | .............. | C08G 61/02 136/263 |
| 2012/0077345 A1 * | 3/2012 | Saito | .............. | C08G 12/26 438/703 |
| 2012/0153424 A1 * | 6/2012 | Oh | .............. | H01L 21/02112 257/499 |
| 2012/0181251 A1 * | 7/2012 | Minegishi | .............. | G03F 7/11 216/49 |
| 2012/0313513 A1 * | 12/2012 | Tanaka | .............. | C08F 26/12 313/504 |
| 2013/0280913 A1 * | 10/2013 | Shinjo | .............. | C09D 139/04 438/694 |
| 2015/0011092 A1 * | 1/2015 | Someya | .............. | C08G 73/06 438/703 |
| 2015/0024519 A1 * | 1/2015 | Yamazaki | .............. | H01L 51/56 438/14 |

FOREIGN PATENT DOCUMENTS

| | | | |
|---|---|---|---|
| CN | 101230127 A | | 7/2008 |
| CN | 102803324 A | | 11/2012 |
| CN | 103229104 A | | 7/2013 |
| CN | 104185816 A | | 12/2014 |
| JP | 06-325872 | * | 11/1994 |
| JP | 11-084644 A | | 3/1999 |
| JP | 2002-241455 | * | 8/2002 |
| JP | 2002241455 A | | 8/2002 |
| JP | 2004-014325 | * | 1/2004 |
| JP | 5641253 B2 | | 12/2014 |
| KR | 10-2011-0026467 A | | 3/2011 |
| KR | 2012-0038447 A | | 4/2012 |

(Continued)

OTHER PUBLICATIONS

Taiwanese Search Report dated Sep. 22, 2016 in Corresponding Taiwanese Patent Application No. 105109097.
Chinese Office Action, dated Nov. 29, 2017.

*Primary Examiner* — Martin Angebranndt
(74) *Attorney, Agent, or Firm* — Lee & Morse, P.C.

(57) ABSTRACT

A polymer includes a first moiety represented by Chemical Formula 1, and a second moiety including a substituted or unsubstituted C6 to C60 cyclic group, a substituted or unsubstituted C6 to C60 hetero cyclic group, or a combination thereof:

[Chemical Formula 1]

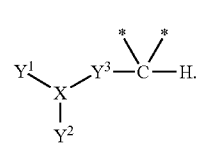

In Chemical Formula 1, X is phosphorus (P), nitrogen (N), boron (B), or P=O, Y1 and Y2 are independently hydrogen or a moiety including at least one substituted or unsubstituted benzene ring, provided that at least one of Y1 and Y2 is the moiety including at least one substituted or unsubstituted benzene ring, Y3 is another moiety including at least one substituted or unsubstituted benzene ring, and * is a linking point.

5 Claims, 1 Drawing Sheet

(56) References Cited

FOREIGN PATENT DOCUMENTS

| KR | 10-1344792 B1 | 12/2013 |
| KR | 10-2014-0069163 A | 6/2014 |
| TW | 201612214 A | 4/2016 |
| WO | WO 2012/077640 A1 | 6/2012 |
| WO | WO 2012/090408 A1 | 7/2012 |

\* cited by examiner

[Calculation Equation 2]
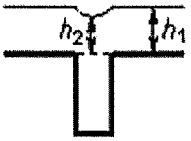
$$\text{Planarization} = \left(1 - \frac{h_2}{h_1}\right) \times 100$$

POLYMER, ORGANIC LAYER COMPOSITION, AND METHOD OF FORMING PATTERNS

CROSS-REFERENCE TO RELATED APPLICATION

Korean Patent Application Nos. 10-2015-0062055, filed on Apr. 30, 2015, and 10-2015-0133998, filed on Sep. 22, 2015 in the Korean Intellectual Property Office, and entitled: "Polymer, Organic Layer Composition, Organic Layer, and Method of Forming Patterns," are incorporated by reference herein in its entirety.

BACKGROUND

1. Field

Embodiments relate to a polymer, an organic layer composition including the polymer, an organic layer manufactured using the organic layer composition, and a method of forming a pattern using the organic layer composition.

2. Description of the Related Art

Recently, a high integration design in accordance with down-sizing (miniaturization) and complexity of an electronic device has accelerated development of more advanced materials and related processes. new patterning materials and technique are also desirable for lithography using a conventional photoresist.

SUMMARY

Embodiments are a polymer including a first moiety represented by Chemical Formula 1, and a second moiety including a substituted or unsubstituted C6 to C60 cyclic group, a substituted or unsubstituted C6 to C60 hetero cyclic group, or a combination thereof:

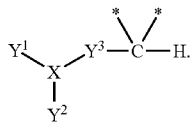

[Chemical Formula 1]

In Chemical Formula 1, X is phosphorus (P), nitrogen (N), boron (B), or P=O, $Y^1$ and $Y^2$ are independently hydrogen or a moiety including at least one substituted or unsubstituted benzene ring, provided that at least one of $Y^1$ and $Y^2$ is the moiety including at least one substituted or unsubstituted benzene ring, $Y^3$ is another moiety including at least one substituted or unsubstituted benzene ring, and * is a linking point.

The polymer may be obtained by a condensation reaction of a substituted or unsubstituted aldehyde compound including at least one of phosphorus (P), nitrogen (N) and boron (B) bonded to Y1, Y2, and Y3, with a compound including at least one of a substituted or unsubstituted C6 to C60 cyclic group and a substituted or unsubstituted C6 to C60 hetero cyclic group.

The second moiety may be a substituted or unsubstituted cyclic group selected from Group 1:

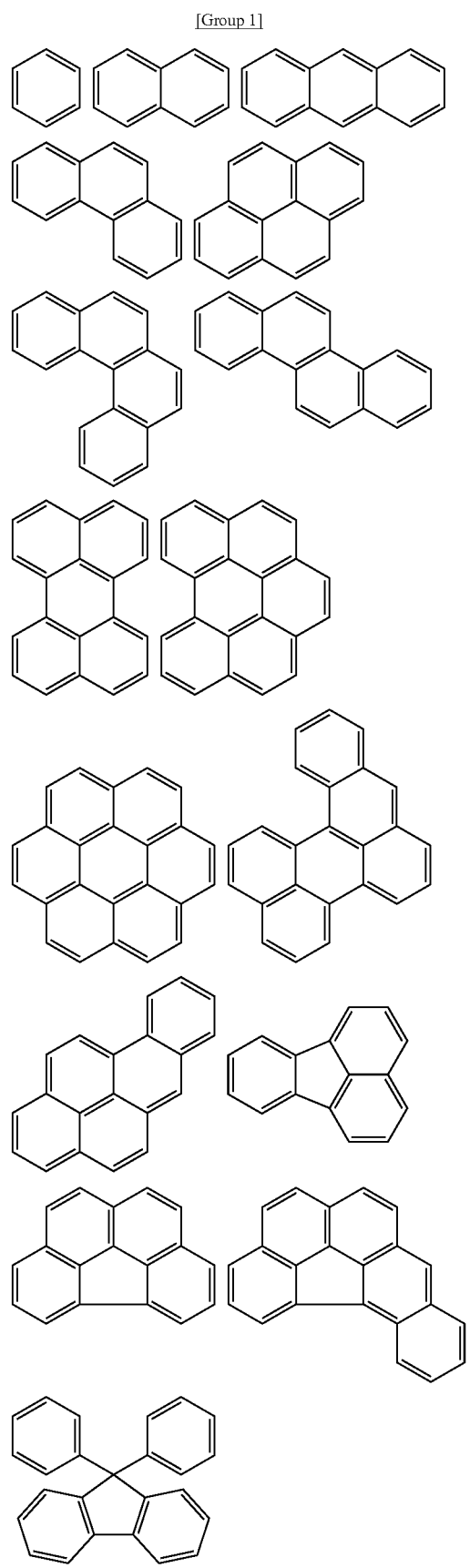

[Group 1]

-continued
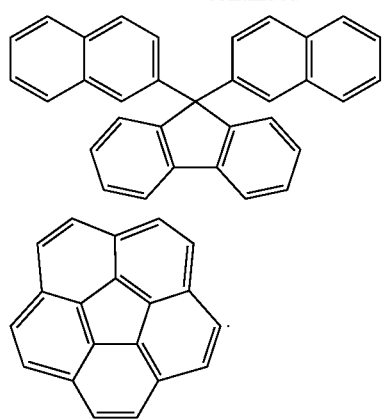
In Group 1, a linking point is not limited.
The second moiety may be a substituted or unsubstituted heterocyclic group selected from Group 2:
[Group 2]
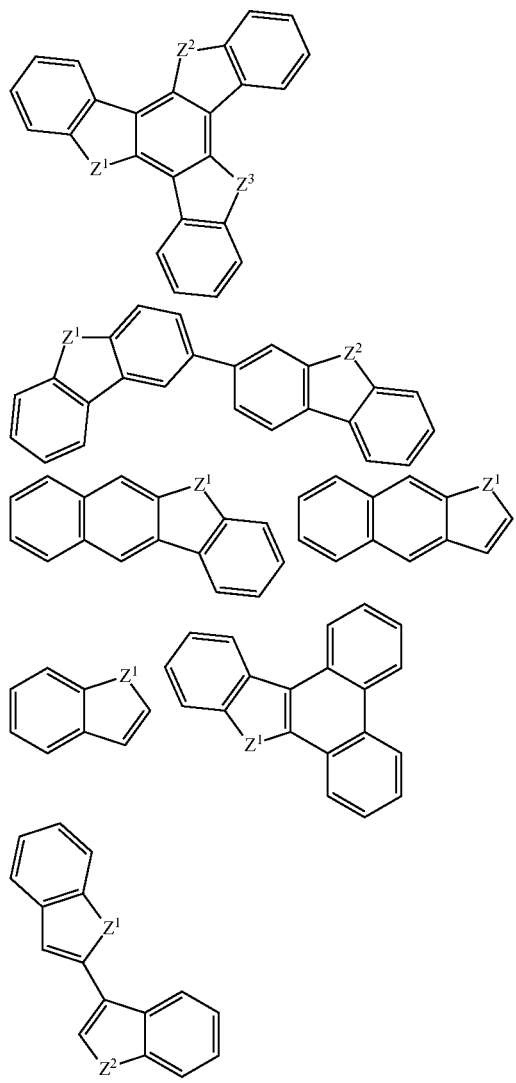
-continued
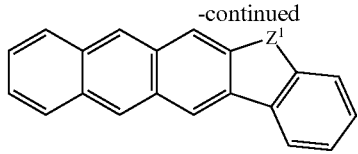
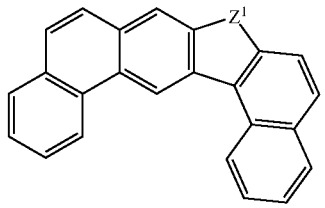
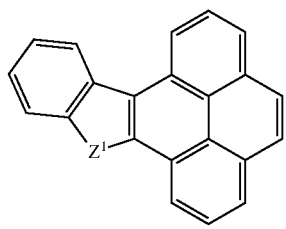
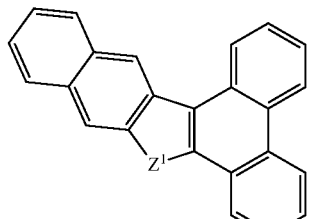
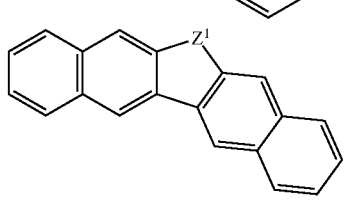
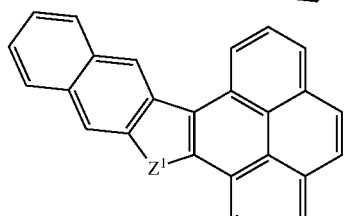
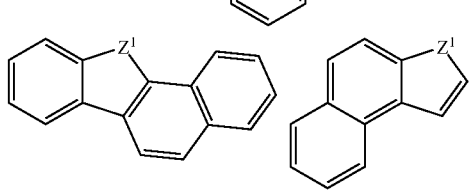
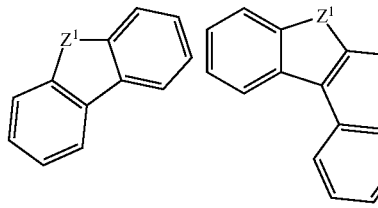
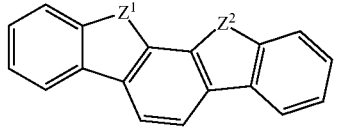

-continued

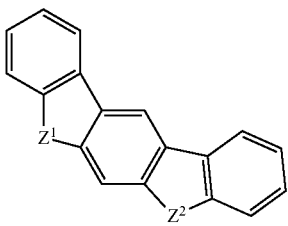

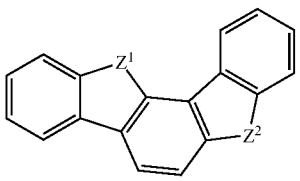

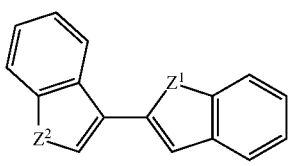

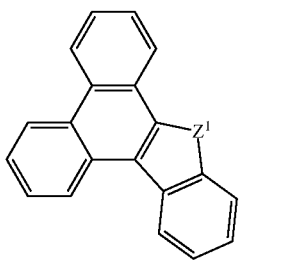

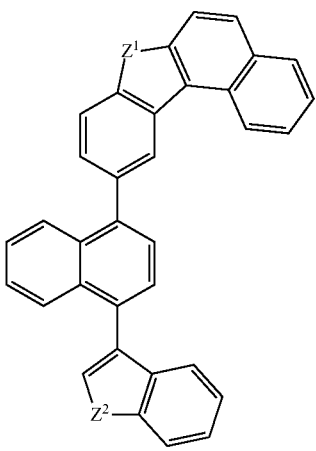

wherein, in Group 2, $Z^1$ to $Z^3$ are independently C=O, oxygen (O), sulfur (S), $CR^aR^b$, $NR^c$, or a combination thereof, wherein $R^a$ to $R^c$ are independently hydrogen, a substituted or unsubstituted C1 to C10 alkyl group, a halogen atom, or a combination thereof, and a linking point is not limited.

The second moiety may include at least two substituted or unsubstituted benzene rings.

In Chemical Formula 1, when $Y^1$ to $Y^3$ are independently a moiety including a substituted or unsubstituted benzene ring, and $Y^1$ and $Y^3$, $Y^2$ and $Y^3$, or $Y^1$ and $Y^2$ may be linked to each other to provide an additional ring.

The first moiety is represented by one of Chemical Formulae 1-1 to 1-5:

[Chemical Formula 1-1]

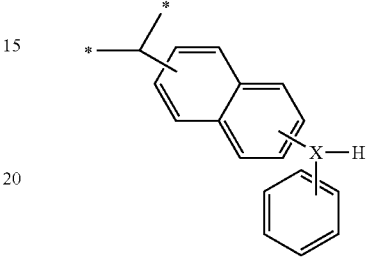

[Chemical Formula 1-2]

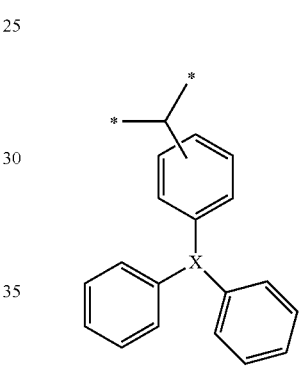

[Chemical Formula 1-3]

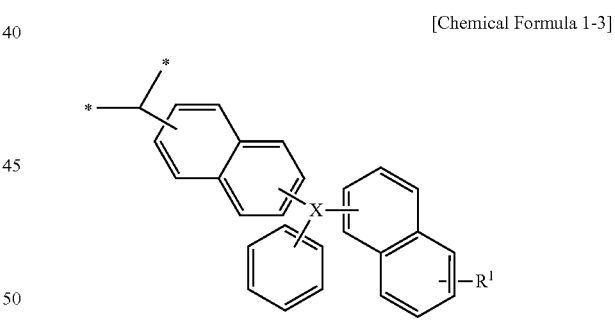

[Chemical Formula 1-4]

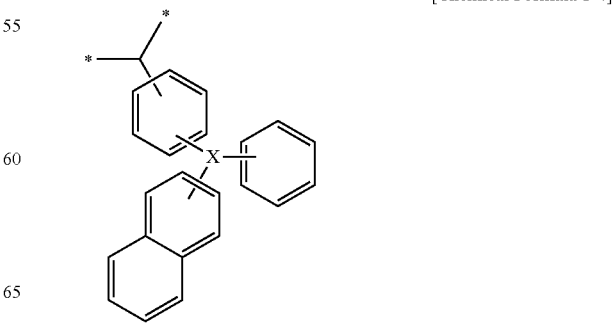

[Chemical Formula 1-5]

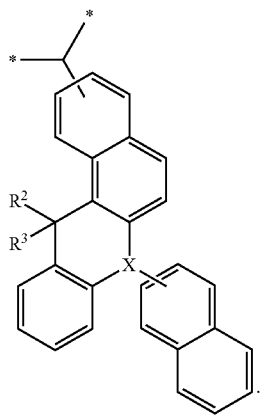

In Chemical Formulae 1-1 to 1-5, X is phosphorus (P), nitrogen (N), boron (B), or P=O, $R^1$ to $R^3$ are independently a hydroxy group, a thionyl group, a thiol group, a cyano group, a substituted or unsubstituted amino group, a halogen atom, a substituted or unsubstituted C1 to C30 alkyl group, a substituted or unsubstituted C1 to C30 alkoxy group, or a combination thereof, and * is a linking point.

The polymer may be represented by one of Chemical Formulae 2 to 6:

[Chemical Formula 2]

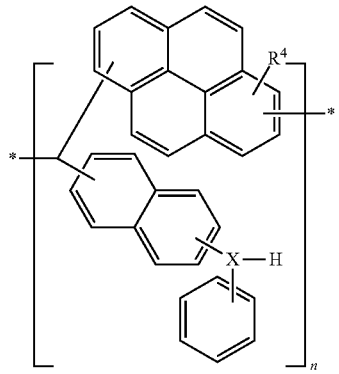

[Chemical Formula 3]

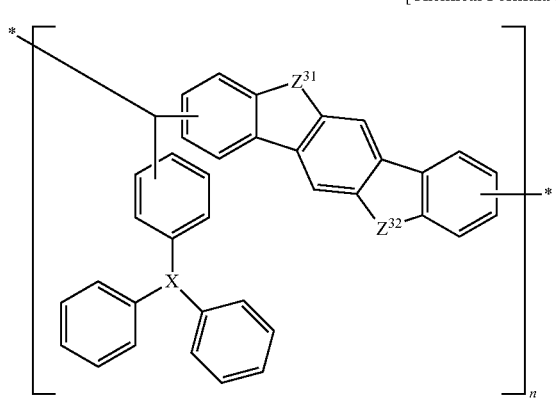

[Chemical Formula 4]

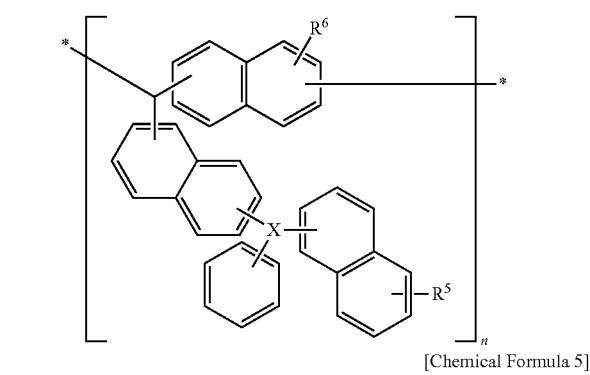

[Chemical Formula 5]

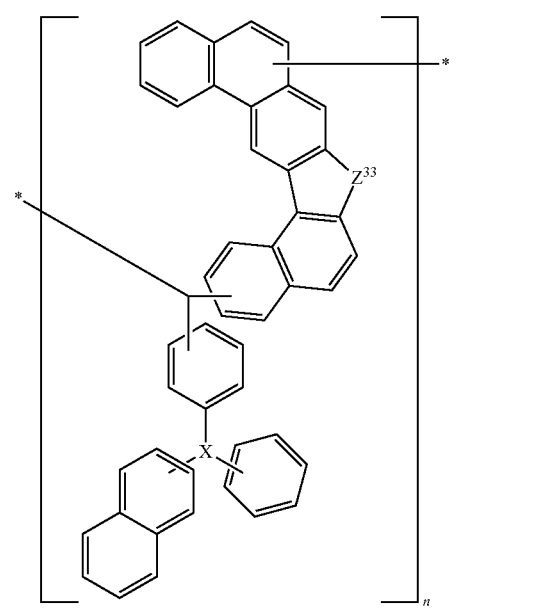

[Chemical Formula 6]

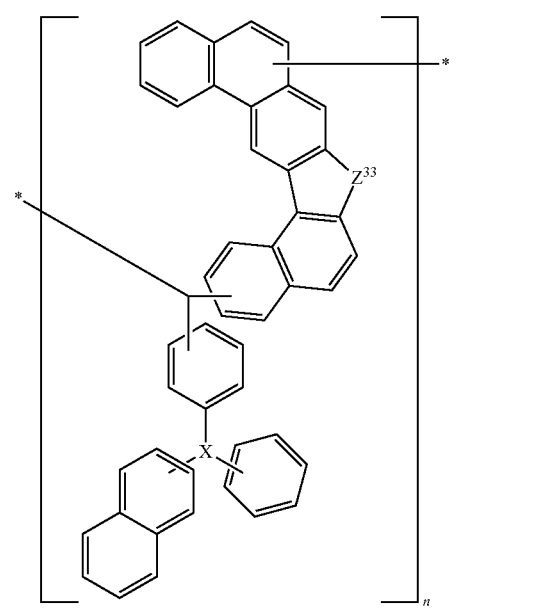

In Chemical Formulae 2 to 6, X is phosphorus (P), nitrogen (N), boron (B), or P=O, $Z^{31}$ to $Z^{34}$ are independently C=O, oxygen (O), sulfur (S), $CR^bR^c$, $NR^d$, or a combination thereof, wherein $R^b$ to $R^d$ are independently hydrogen, a substituted or unsubstituted C1 to C10 alkyl group, a halogen atom, or a combination thereof, $R^4$ to $R^8$ are independently a hydroxy group, a thionyl group, a thiol group, a cyano group, a substituted or unsubstituted amino group, a halogen atom, a substituted or unsubstituted C1 to C30 alkyl group, a substituted or unsubstituted C1 to C30 alkoxy group, or a combination thereof, n is an integer ranging from 2 to 200, and * is a linking point.

The polymer may have a weight average molecular weight of about 500 to about 20,000.

Embodiments are also directed to an organic layer composition including the polymer as claimed in claim 1 and a solvent.

The polymer may be obtained by a condensation reaction of a substituted or unsubstituted aldehyde compound including at least one of phosphorus (P), nitrogen (N) and boron (B) bonded to $Y_1$, $Y_2$, and $Y_3$, with a compound including at least one of a substituted or unsubstituted C6 to C60 cyclic group and a substituted or unsubstituted C6 to C60 hetero cyclic group.

The second moiety may be a substituted or unsubstituted cyclic group selected from Group 1:

[Group 1]

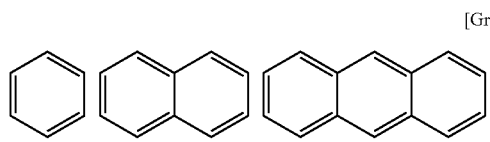

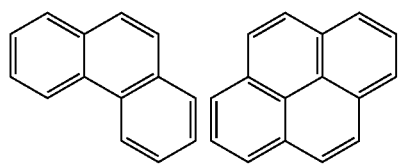

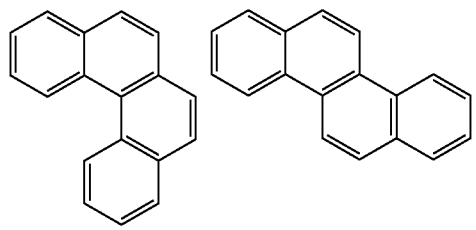

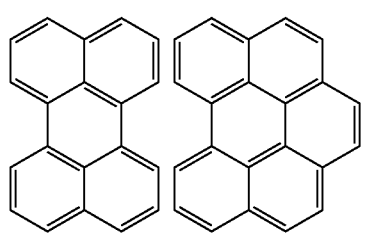

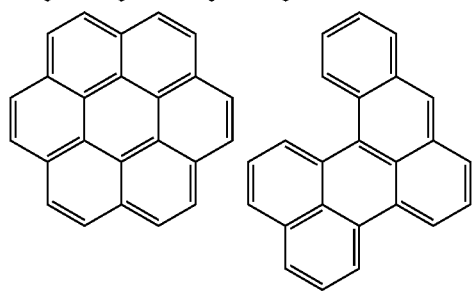

-continued

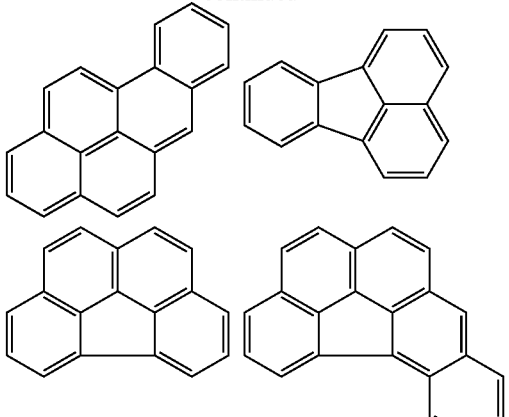

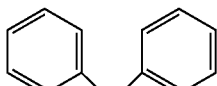

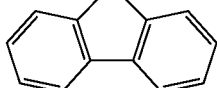

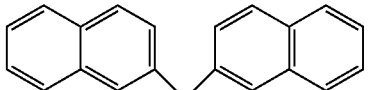

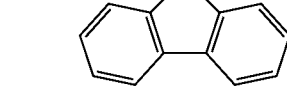

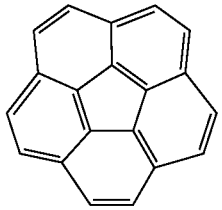

wherein, in Group 1, a linking point is not limited.

The second moiety may be a substituted or unsubstituted heterocyclic group selected from Group 2:

[Group 2]

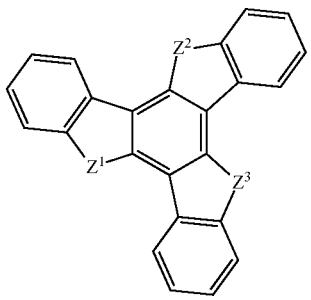

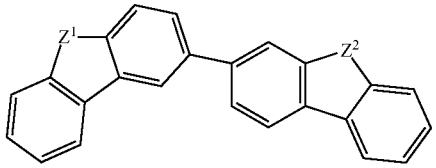

-continued
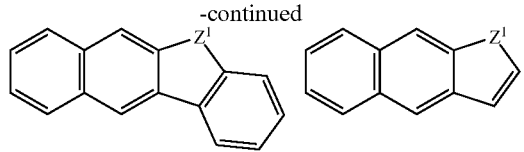
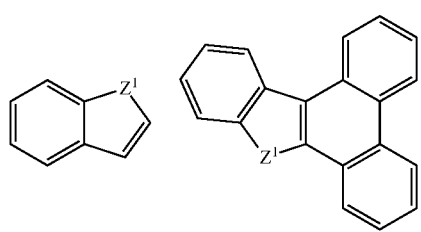
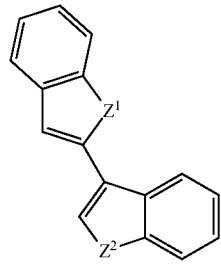
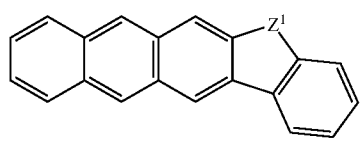
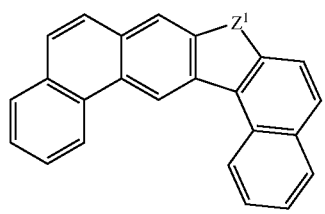
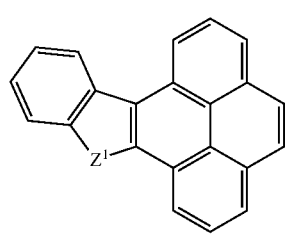
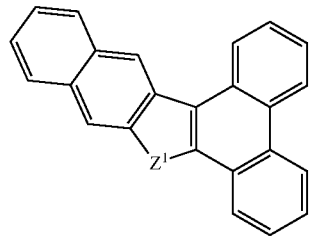
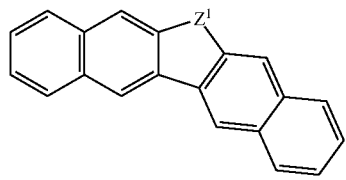
-continued
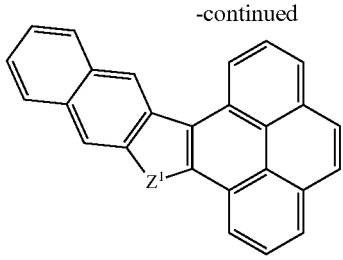
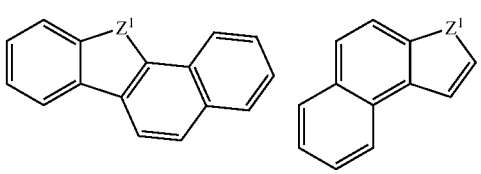
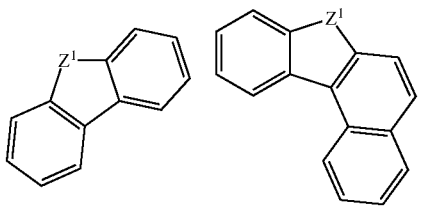
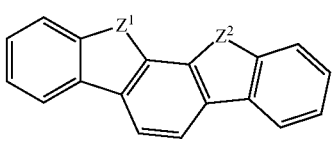
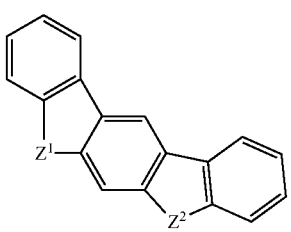
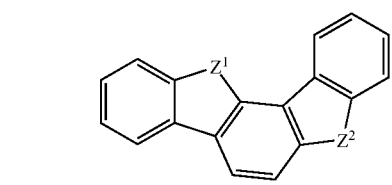
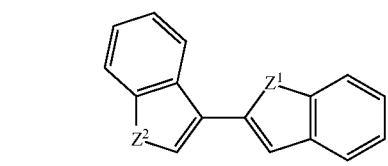
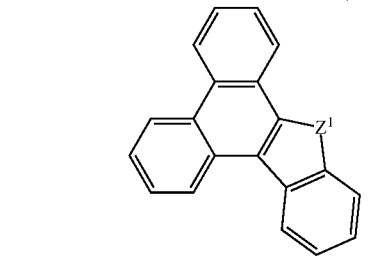

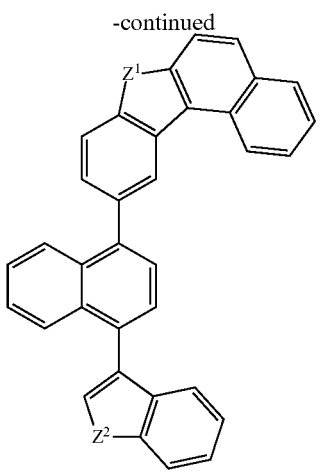

In Group 2, $Z^1$ to $Z^3$ are independently C=O, oxygen (O), sulfur (S), One, $NR^c$, or a combination thereof, wherein $R^a$ to $R^c$ are independently hydrogen, a substituted or unsubstituted C1 to C10 alkyl group, a halogen atom, or a combination thereof, and a linking point is not limited.

The second moiety may include at least two substituted or unsubstituted benzene rings.

In Chemical Formula 1, when $Y^1$ to $Y^3$ are independently a moiety including a substituted or unsubstituted benzene ring, $Y^1$ and $Y^3$, $Y^2$ and $Y^3$ or $Y^1$ and $Y^2$ may be linked to each other to provide an additional ring.

The first moiety may be represented by one of Chemical Formulae 1-1 to 1-5:

[Chemical Formula 1-1]

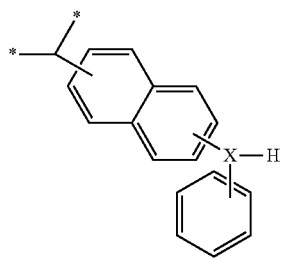

[Chemical Formula 1-2]

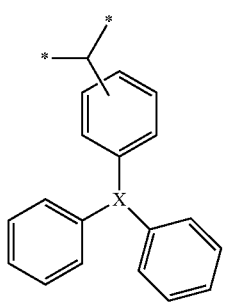

[Chemical Formula 1-3]

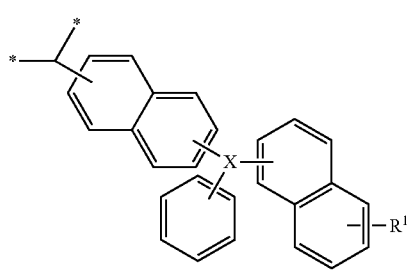

[Chemical Formula 1-4]

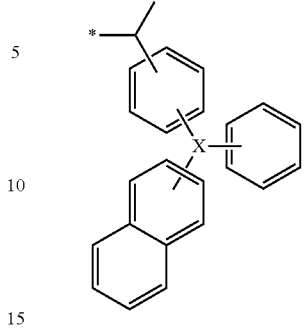

[Chemical Formula 1-5]

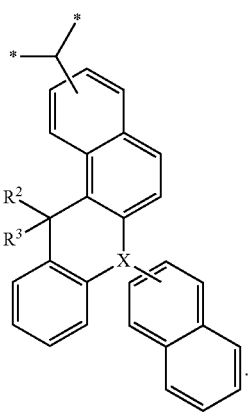

In Chemical Formulae 1-1 to 1-5, X is phosphorus (P), nitrogen (N), boron (B), or P=O, $R^1$ to $R^3$ are independently a hydroxy group, a thionyl group, a thiol group, a cyano group, a substituted or unsubstituted amino group, a halogen atom, a substituted or unsubstituted C1 to C30 alkyl group, a substituted or unsubstituted C1 to C30 alkoxy group, or a combination thereof, and * is a linking point.

The polymer may be represented by one of Chemical Formulae 2 to 6:

[Chemical Formula 2]

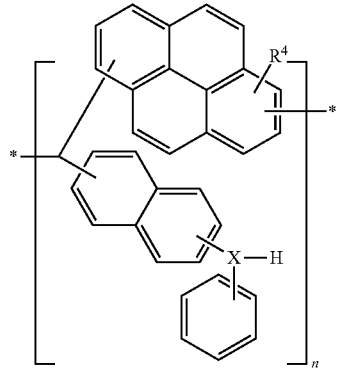

[Chemical Formula 3]

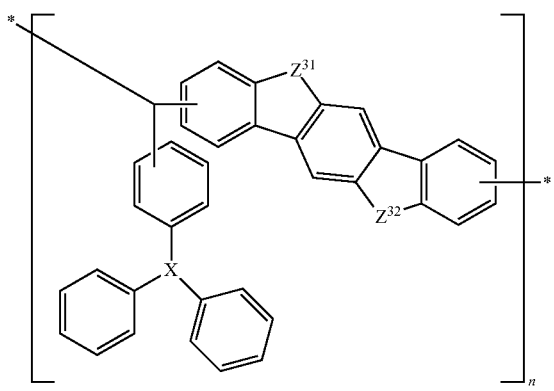

[Chemical Formula 4]

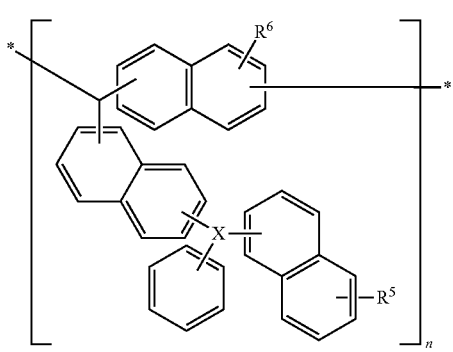

[Chemical Formula 5]

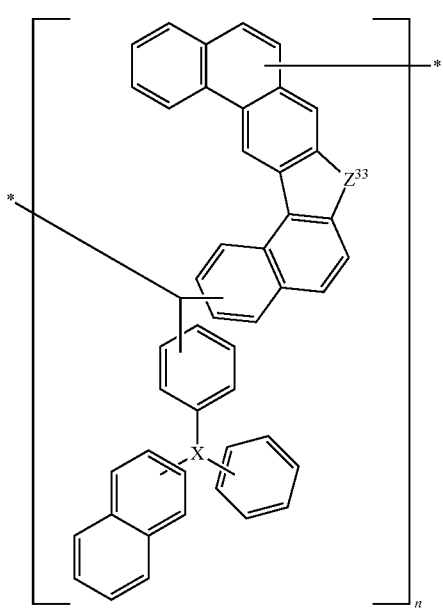

[Chemical Formula 6]

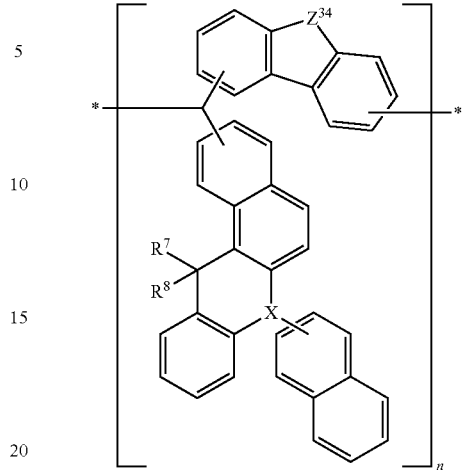

In Chemical Formulae 2 to 6, X is phosphorus (P), nitrogen (N), boron (B), or P=O, $Z^{31}$ to $Z^{34}$ are independently C=O, oxygen (O), sulfur (S), $CR^bR^c$, $NR^d$, or a combination thereof, wherein $R^b$ to $R^d$ are independently hydrogen, a substituted or unsubstituted C1 to C10 alkyl group, a halogen atom, or a combination thereof, $R^4$ to $R^8$ are independently a hydroxy group, a thionyl group, a thiol group, a cyano group, a substituted or unsubstituted amino group, a halogen atom, a substituted or unsubstituted C1 to C30 alkyl group, a substituted or unsubstituted C1 to C30 alkoxy group, or a combination thereof, n is an integer ranging from 2 to 200, and * is a linking point.

The polymer may have a weight average molecular weight of about 500 to about 20,000.

The polymer may be included in an amount of about 0.1 wt % to about 50 wt % based on the total amount of the organic layer composition.

Embodiments are also directed to an organic layer obtained by curing the organic layer composition. The organic layer may be a hardmask layer.

Embodiments are also directed to a method of forming a pattern including providing a material layer on a substrate, applying the organic layer composition as claimed in claim 10 on the material layer, heat-treating the organic layer composition to provide a hardmask layer, providing a silicon-containing thin layer on the hardmask layer, providing a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer to form the pattern.

The organic layer composition may be applied using a spin-on coating method.

The method may further include providing a bottom antireflective coating (BARC) before providing the photoresist layer.

BRIEF DESCRIPTION OF THE DRAWING

Features will become apparent to those of skill in the art by describing in detail exemplary embodiments with reference to the attached drawing in which:

FIG. 1 illustrates a reference drawing for explaining Calculation Equation 2 to evaluate planarization characteristics.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers may be exaggerated for clarity of illustration.

As used herein, when a definition is not otherwise provided, the term 'substituted' may refer to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C20 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C30 heterocycloalkyl group, and a combination thereof, instead of hydrogen of a compound.

As used herein, when a definition is not otherwise provided, the term 'hetero' refers to one including 1 to 3 heteroatoms selected from B, N, O, S, and P.

As used herein, 'a derived group' from a compound refers to a group in which at least one hydrogen of the compound is replaced with a substituent. For example, 'a monovalent group' derived from an A compound refers to a monovalent group obtained by substituting one hydrogen in the A compound. For example, a monovalent group derived from a benzene group is a phenyl group. In addition, 'a divalent group' derived from an A compound refers to a divalent group obtained by substituting two hydrogen to form two linking points in the A compound. For example, a divalent group derived from a benzene group is a phenylene group.

Hereinafter, a polymer according to an embodiment is described.

A polymer according to an embodiment includes a first moiety represented by Chemical Formula 1 and a second moiety including a substituted or unsubstituted C6 to C60 cyclic group, a substituted or unsubstituted C6 to C60 hetero cyclic group, or a combination thereof

[Chemical Formula 1]

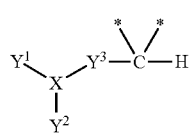

In Chemical Formula 1,

X is phosphorus (P), nitrogen (N), boron (B), or P=O, $Y^1$ and $Y^2$ are independently hydrogen or a moiety including at least one substituted or unsubstituted benzene ring, where at least one of the $Y^1$ and $Y^2$ is the moiety including at least one substituted or unsubstituted benzene ring, $Y^3$ is another moiety including at least one substituted or unsubstituted benzene ring, and \* is a linking point.

The first moiety represented by Chemical Formula 1 may have a structure where X is a hetero atom (phosphorus (P), nitrogen (N), boron (B), or P=O), and two or three substituent moieties ($Y^1$, $Y^2$, and $Y^3$) are linked to the hetero atom.

In Chemical Formula 1, $Y^1$, $Y^2$, and $Y^3$ may be independently a moiety including at least one substituted or unsubstituted benzene ring. Herein 'a moiety including at least one substituted or unsubstituted benzene ring' includes a cyclic group provided by linking substituted or unsubstituted aromatic ring groups to each other as well as a substituted or unsubstituted aromatic ring group.

For example, in Chemical Formula 1 $Y^1$, $Y^2$ and $Y^3$ may independently be selected from a substituted or unsubstituted benzene, a substituted or unsubstituted naphthalene, a substituted or unsubstituted anthracene, a substituted or unsubstituted pyrene, a substituted or unsubstituted perylene, a substituted or unsubstituted benzoperylene, a substituted or unsubstituted coronene, a substituted or unsubstituted triphenylene, a substituted or unsubstituted phenanthrene, a substituted or unsubstituted corannulene, and a substituted or unsubstituted chrysene.

As another example, when $Y^1$ to $Y^3$ in Chemical Formula 1 are a moiety independently including a substituted or unsubstituted benzene ring, $Y^1$ and $Y^3$, $Y^2$ and $Y^3$, or $Y^1$ and $Y^2$ may be, for example, linked each other and form an additional ring. Herein, the additional ring may be a cyclic group formed by linking $Y^1$ and $Y^3$, $Y^2$ and $Y^3$, or $Y^1$ and $Y^2$ to one another to form a ring formed by aromatic ring groups linked to one another. The "cyclic group formed by aromatic ring groups linked each other" indicates a group in which one carbon in one aromatic ring is directly or indirectly linked with one carbon of another aromatic ring. The formed additional ring may include X as a member (see, for example, Chemical Formula 6, below).

The first moiety may be a monovalent group derived from a substituted or unsubstituted aldehyde compound including at least one of phosphorus (P), nitrogen (N) and boron (B). The term "aldehyde compound" refers to a compound including an aldehyde group in its structure. The aldehyde compound may include $Y_1$, $Y_2$, and $Y_3$ bonded to the at least one of phosphorus (P), nitrogen (N) and boron (B).

For example, the polymer may be obtained by a condensation reaction of a substituted or unsubstituted aldehyde compound (referred to as a first compound) including at least one of phosphorus (P), nitrogen (N) and boron (B) with a compound (referred to as a second compound) including at least one of a substituted or unsubstituted C6 to C60 cyclic group and a substituted or unsubstituted C6 to C60 hetero cyclic group. In the polymer, the first moiety may be derived from the first compound, and the second moiety may be derived from the second compound.

A hetero atom such as the phosphorus (P), the nitrogen (N), or the boron (B) included in the first compound may act as a flame retardant in the formed polymer as well as a reducing agent during a condensation reaction. The phosphorus, nitrogen, or boron atom may improve the etch resistance of the polymer. In addition, the polymer may include, for example, a hetero atom such as nitrogen, oxygen, or the like and thus may have larger polarity and may secure excellent solubility.

As examples, the first moiety may be represented by one of Chemical Formulae 1-1 to 1-5.

[Chemical Formula 1-1]

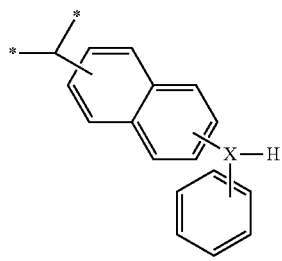

[Chemical Formula 1-2]

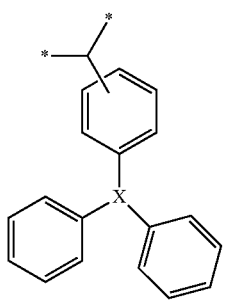

[Chemical Formula 1-3]

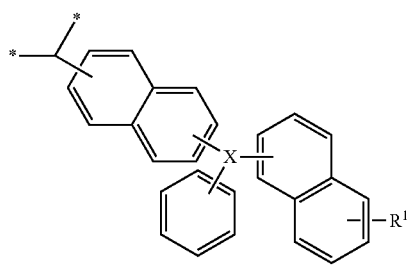

[Chemical Formula 1-4]

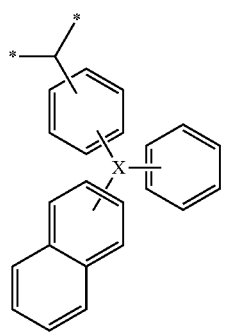

[Chemical Formula 1-5]

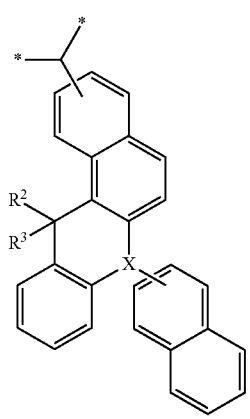

In Chemical Formulae 1-1 to 1-5,

X is phosphorus (P), nitrogen (N), boron (B), or P=O, $R^1$ to $R^3$ are independently a hydroxy group, a thionyl group, a thiol group, a cyano group, a substituted or unsubstituted amino group, a halogen atom, a substituted or unsubstituted C1 to C30 alkyl group, a substituted or unsubstituted C1 to C30 alkoxy group, or a combination thereof, and

* is a linking point.

The second moiety may include a substituted or unsubstituted C6 to C60 cyclic group, a substituted or unsubstituted C6 to C60 hetero cyclic group, or a combination thereof.

For example, the second moiety may be a substituted or unsubstituted cyclic group selected from Group 1.

[Group 1]

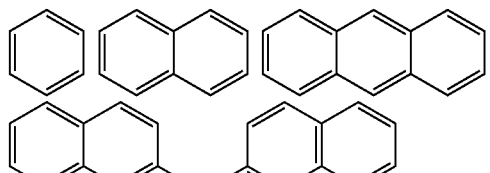

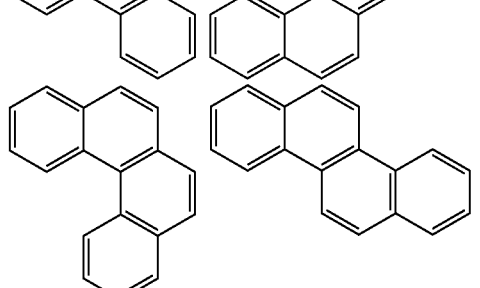

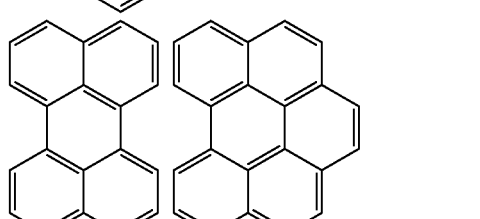

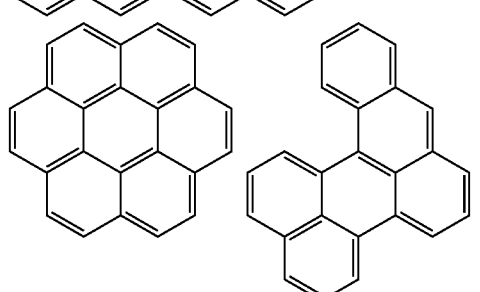

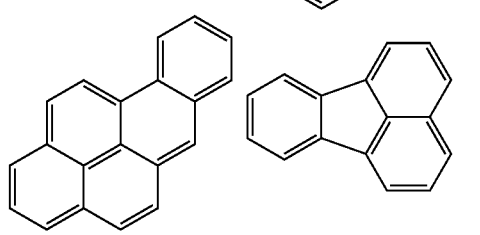

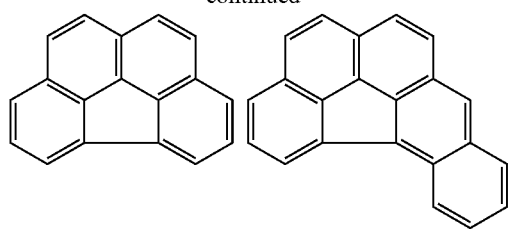
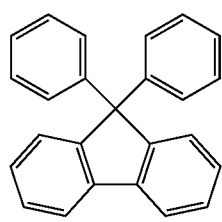
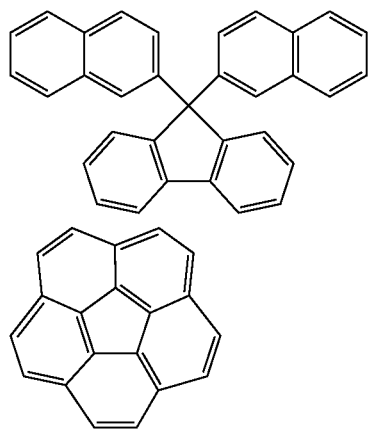
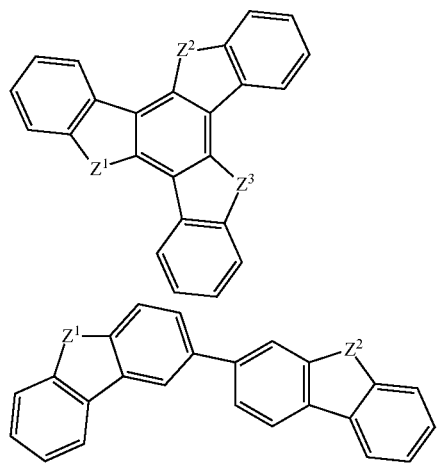
In Group 1, a linking point is not limited.
For example, the second moiety may be a polycyclic cyclic group including at least two substituted or unsubstituted benzene rings. Thereby, the polymer may have further improved rigid characteristics.
For example, the second moiety may be a substituted or unsubstituted heterocyclic group selected from Group 2.
[Group 2]
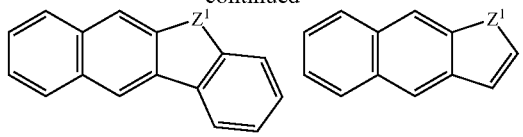
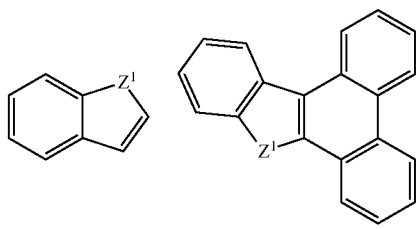
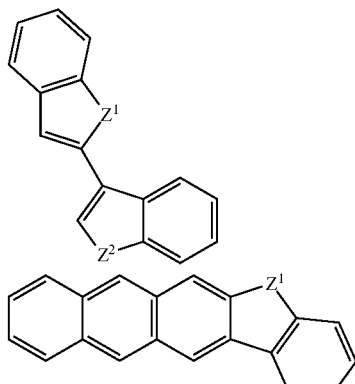
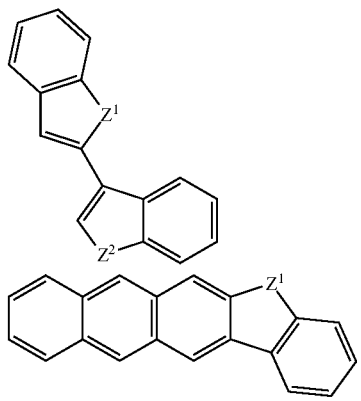
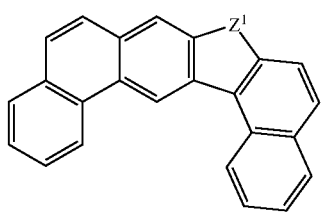
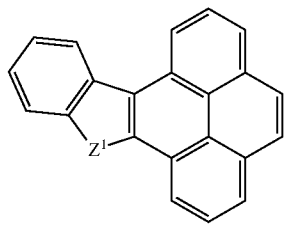
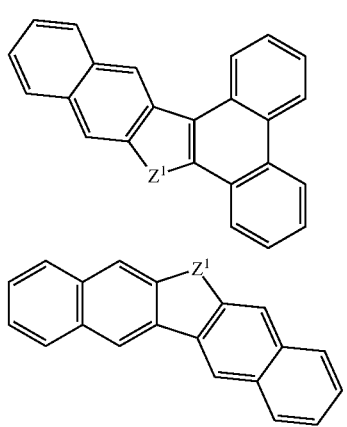

-continued

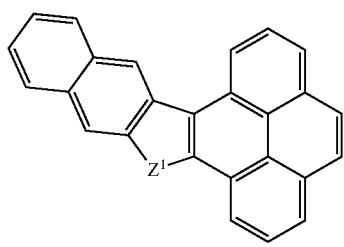
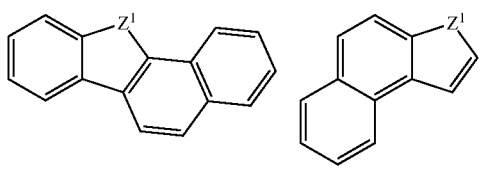
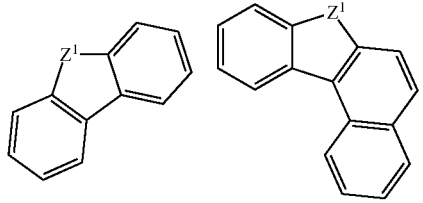
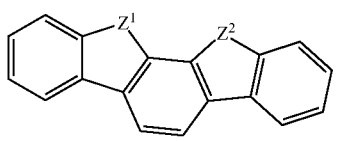
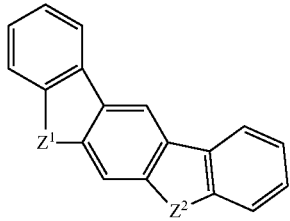
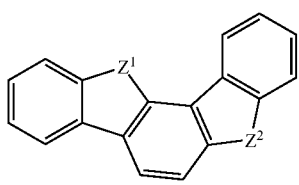
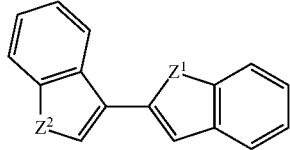
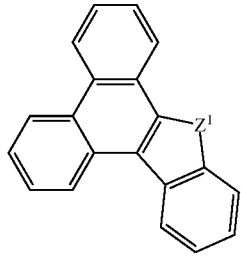

-continued

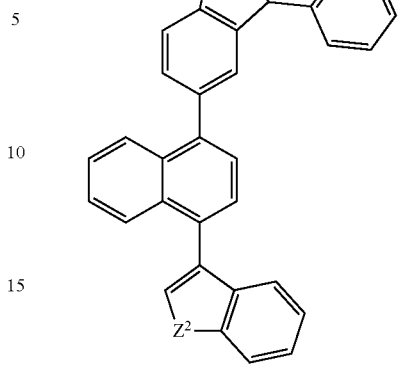

In Group 2, $Z^1$ to $Z^3$ are independently C=O, oxygen (O), sulfur (S), $CR^aR^b$, $NR^c$, or a combination thereof, wherein $R^a$ to $R^c$ are independently hydrogen, a substituted or unsubstituted C1 to C10 alkyl group, a halogen atom, or a combination thereof.

In Group 2, a linking point is not limited.

The second moiety may include at least one nitrogen atom. For example, in

Group 2, $Z^1$ may be $NR^c$, wherein $R^c$ is independently hydrogen, a substituted or unsubstituted C1 to C10 alkyl group, a halogen atom, or combination thereof A polymer according to one embodiment may include the first moiety and the second moiety. The polymer may be, for example, represented by one of Chemical Formulae 2 to 6.

[Chemical Formula 2]

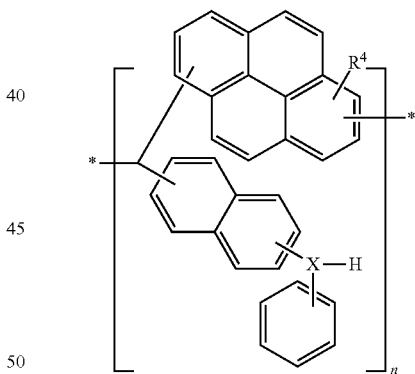

[Chemical Formula 3]

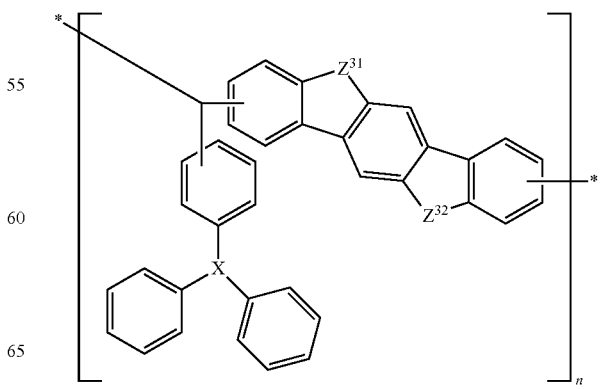

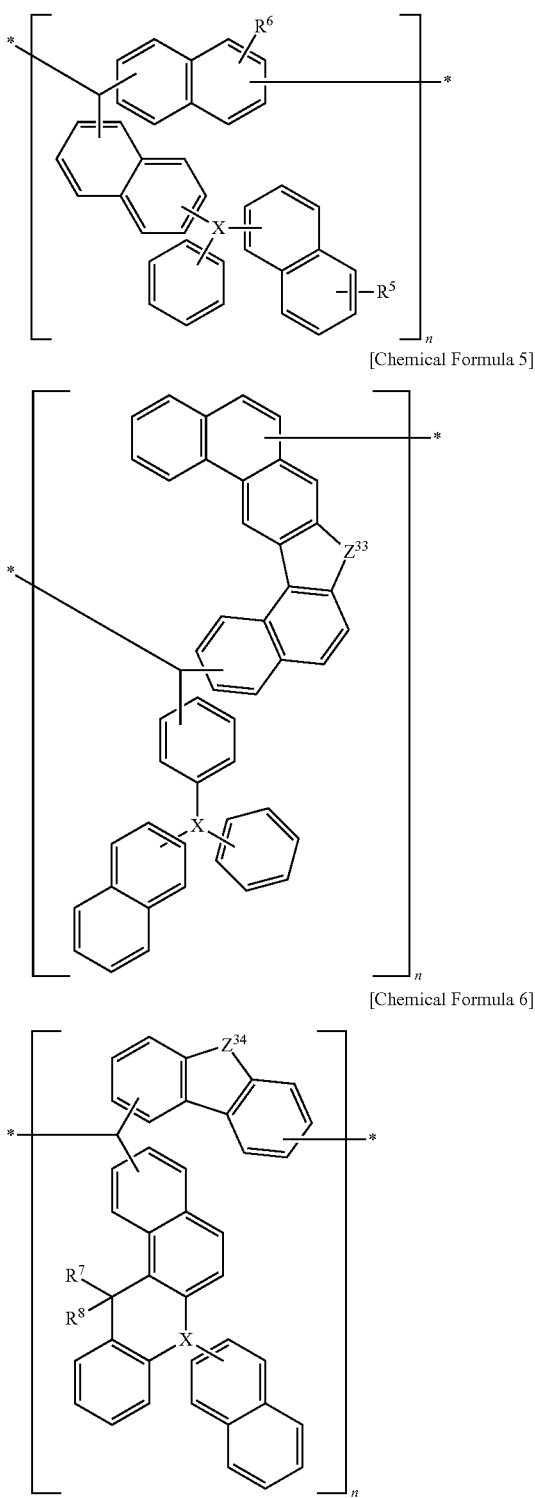

[Chemical Formula 4]

[Chemical Formula 5]

[Chemical Formula 6]

In Chemical Formulae 2 to 6,

X is phosphorus (P), nitrogen (N), boron (B), or P=O, $Z^{31}$ to $Z^{34}$ are independently C=O, oxygen (O), sulfur (S), $CR^bR^c$, $NR^d$, or a combination thereof, wherein $R^b$ to $R^d$ are independently hydrogen, a substituted or unsubstituted C1 to C10 alkyl group, a halogen atom, or a combination thereof, $R^4$ to $R^8$ are independently a hydroxy group, a thionyl group, a thiol group, a cyano group, a substituted or unsubstituted amino group, a halogen atom, a substituted or unsubstituted C1 to C30 alkyl group, a substituted or unsubstituted C1 to C30 alkoxy group, or a combination thereof, n is an integer ranging from 2 to 200, and

* is a linking point.

The polymer may have a weight average molecular weight of, for example, about 500 to about 20,000. When the polymer has a weight average molecular weight within the range, an organic layer composition (e.g., a hard mask composition) including the polymer may be optimized by adjusting the amount of carbon and solubility in a solvent.

When the polymer is used as an organic layer material, not only may a uniform thin film be obtained without forming a pin hole and a void during a baking process or deteriorating a thinness distribution, but also excellent gap-fill and planarization characteristics may be obtained when a lower substrate (or a film) has an inward step or when a pattern is formed.

According to another embodiment, an organic layer composition including the polymer and a solvent is provided.

The solvent may be a suitable solvent having sufficient dissolubility or dispersion for the polymer. The solvent may be, for example at least one selected from propylene glycol, propylene glycol diacetate, methoxy propanediol, diethylene glycol, diethylene glycol butylether, tri(ethylene glycol) monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone and ethyl 3-ethoxypropionate.

The polymer may be present in an amount of about 0.1 to about 50 wt % based on the total amount of the organic layer composition. When the polymer is included in the range, a thickness, surface roughness and planarization of the organic layer may be controlled.

The organic layer composition may further include an additive such as a surfactant, a cross-linking agent, a thermal acid generator, a plasticizer, or the like.

The surfactant may include, for example, alkylbenzene sulfonate salt, alkyl pyridinium salt, polyethylene glycol, or a quaternary ammonium salt.

The cross-linking agent may be, for example, a melamine-based, a substituted urea-based, or a polymer-based agent thereof. For example, a cross-linking agent having at least two cross-linking forming substituents may be, for example, a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or methoxymethylated thiourea, or the like.

The cross-linking agent may be a cross-linking agent having a high heat resistance. The cross-linking agent having a high heat resistance may be a compound including a cross-linking substituent including an aromatic ring (for example a benzene ring, or a naphthalene ring) in the molecule.

The thermal acid generator may be, for example an acidic compound such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, naphthalene carbonic acid or the like or/and 2,4,4,6-tetrabromocyclohexadienone, benzointosylate, 2-nitrobenzyltosylate, other organosulfonic acid alkylester, or the like.

The additive may be present in an amount of about 0.001 to 40 parts by weight based on 100 parts by weight of the organic layer composition. When the additive is included within the range, solubility may be improved without changing optical properties of the organic layer composition.

According to another embodiment, an organic layer manufactured using the organic layer composition is provided. The organic layer may be, for example, formed by coating the organic layer composition on a substrate and heat-treating to cure the organic layer. The organic layer may be, for example, a hardmask layer, a planarization layer, a sacrificial layer, a filler, or the like for an electronic device.

Hereafter, a method for forming a pattern by using the organic layer composition is described.

A method of a forming pattern may include providing a material layer on a substrate, applying the organic layer composition including the polymer and a solvent onto the material layer, heat-treating the organic layer composition to provide a hardmask layer, providing a silicon-containing thin layer on the hardmask layer, providing a photoresist layer on the silicon-containing thin layer, exposing and developing the photoresist layer to form a photoresist pattern, selectively removing the silicon-containing thin layer and the hardmask layer using the photoresist pattern to expose a part of the material layer and etching an exposed part of the material layer.

The substrate may be, for example, a silicon wafer, a glass substrate, or a polymer substrate.

The material layer may be a material to be finally patterned, for example, a metal layer such as an aluminum layer or a copper layer, a semiconductor layer such as a silicon layer, or an insulation layer such as a silicon oxide layer or a silicon nitride layer. The material layer may be formed through a method such as a chemical vapor deposition (CVD) process.

The organic layer composition may be the same as described above. The organic layer composition may be applied by spin-on coating in a form of a solution. A thickness of the organic layer composition may be, for example about 50 Å to about 10,000 Å.

Heat-treating the organic layer composition may be performed, for example, at about 100 to about 500° C. for about 10 seconds to 1 hour.

The silicon-containing thin layer may be formed of, for example, a material such as SiCN, SiOC, SiON, SiOCN, SiC and/or SiN or the like.

The method may further include forming a bottom anti-reflective coating (BARC) before forming the photoresist layer on the silicon-containing thin layer.

Exposure of the photoresist layer may be performed using, for example, ArF, KrF, or EUV. After exposure, heat treatment may be performed at about 100° C. to about 500° C.

The etching process of the exposed part of the material layer may be performed through a dry etching process using an etching gas. The etching gas may be, for example $CHF_3$, $CF_4$, $Cl_2$, $BCl_3$, or a mixed gas thereof.

The etched material layer may be formed as a plurality of patterns, The plurality of pattern may be a metal pattern, a semiconductor pattern, an insulation pattern, or the like. For example, the patterns may be diverse patterns of a semiconductor integrated circuit device.

The following Synthesis Examples, Comparative Synthesis Examples, Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Example

Synthesis Example 1

Hydroxypyrene (21.84 g, 0.1 mol), 6-(phenylamino)-2-naphthaldehyde (24.75 g, 0.1 mol), p-toluenesulfonic acid monohydrate (19.04 g, 0.1 mol) (as an acid catalyst), and 1,4-dioxane (196.9 g) were put in a 500 ml flask equipped with a thermometer, a condenser, and a mechanical stirrer and stirred at 120° C. When a specimen taken from the polymerization reactant every hour had a weight average molecular weight in a range of 2,000 to 3,000, the reaction was considered as completed.

When the reaction was complete, tetrahydrofuran and ethylacetate were added thereto, and the mixture was treated three times repetitively with distilled water to remove an acid catalyst. Then, ethylacetate was added thereto to extract an organic layer, and the organic layer was extracted under a reduced pressure. Subsequently, 50 g of tetrahydrofuran was added thereto, and the mixture was precipitated with 300 g of hexane, and 1,4-dioxane and monomers remaining in the mixture were removed, obtaining a polymer represented by Chemical Formula 1a (Mw: 2,300).

[Chemical Formula 1a]

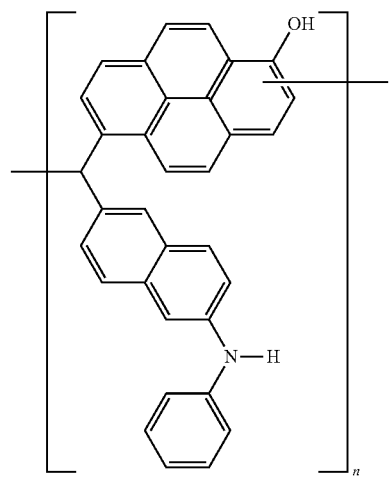

Synthesis Example 2

5,11-dihydroindolo[3,2-b]carbazole (25.65 g, 0.1 mol), 4-(diphenylphosphino)benzaldehyde (29.06 g, 0.1 mol), p-toluenesulfonic acid monohydrate (19.04 g, 0.1 mol), and 1,4-dioxane (221.2 g) were put in a 500 ml flask equipped with a thermometer, a condenser, and a mechanical stirrer and stirred at 120° C. When a specimen taken from the polymerization reactant every hour had a weight average molecular weight in a range of 2,000 to 3,000, the reaction was considered as completed. When the reaction was complete, tetrahydrofuran and ethylacetate were added thereto, and the mixture was treated with distilled water three times repetitively to remove the acid catalyst. Then, ethylacetate was added thereto to extract an organic layer, and the organic layer was extracted under a reduced pressure. Subsequently, 50 g of tetrahydrofuran was added thereto, the mixture was precipitated with 300 g of hexane, and 1,4-dioxane and monomers remaining in the mixture were removed, obtaining a polymer represented by Chemical Formula 1b (Mw: 2150).

[Chemical Formula 1b]

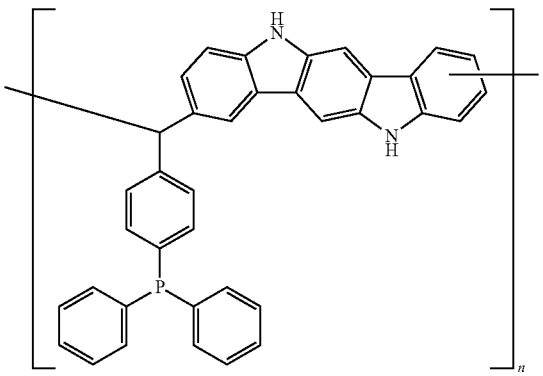

Synthesis Example 3

2-naphthol (14.43 g, 0.1 mol), 6-((6-methoxynaphthalen-2-yl) (phenyl)amino)-2-naphthaldehyde (40.38 g, 0.1 mol), p-toluenesulfonic acid monohydrate (19.04 g, 0.1 mol), and 1,4-dioxane (221.6 g) were put in a 500 ml flask equipped with a thermometer, a condenser, and a mechanical stirrer and stirred at 120° C. When a specimen taken from the polymerization reactant by every hour had a weight average molecular weight ranging from 2,000 to 3,000, the reaction was considered as completed. When the reaction was complete, tetrahydrofuran and ethylacetate were added thereto, and the mixture was treated three times repetitively with distilled water to remove the acid catalyst. Then, ethylacetate was added thereto to extract an organic layer, and the organic layer was extracted under a reduced pressure. Subsequently, 50 g of tetrahydrofuran was added thereto, the mixture was precipitated with 300 g of hexane, and 1,4-dioxane and monomers remaining in the mixture were removed, obtaining a polymer represented by Chemical Formula 1c (Mw: 2930).

[Chemical Formula 1c]

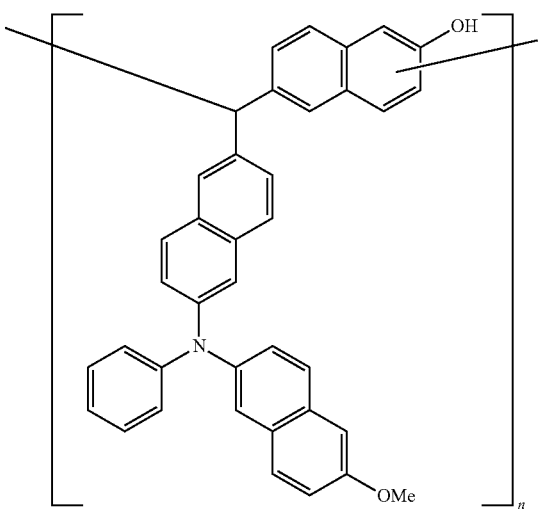

Synthesis Example 4

7H-benzo[g]naphtho[2,1-b]carbazole (15.88 g, 0.05 mol), 4-(naphthalen-2-yl(phenyl)phosphoryl)benzaldehyde (17.83 g, 0.05 mol), p-toluenesulfonic acid monohydrate (9.52 g, 0.05 mol), and 1,4-dioxane (129.7 g) were put in a 500 ml flask equipped with a thermometer, a condenser, and a mechanical stirrer and stirred at 120° C. When a specimen taken from the polymerization reactant by every one hour had a weight average molecular weight in a range of 2,000 to 3,000, the reaction was considered as completed. When the reaction was complete, tetrahydrofuran and ethylacetate were added thereto, and the mixture was treated three times repetitively with distilled water to remove the acid catalyst. Then, ethylacetate was added to extract an organic layer, and the organic layer was extracted under a reduced pressure. Subsequently, 30 g of tetrahydrofuran was added thereto, the mixture was precipitated with 200 g of hexane, and 1,4-dioxane and monomers remaining in the mixture were removed, obtaining a polymer represented by Chemical Formula 1d (Mw: 2410).

[Chemical Formula 1d]

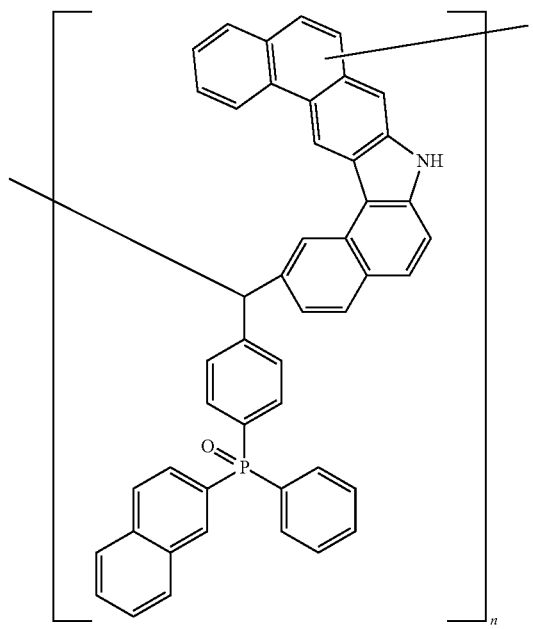

Synthesis Example 5

Carbazole (8.37 g, 0.05 mol), 12,12-dimethyl-7-(naphthalen-1-yl)-7,12-dihydrobenzo[a]acridine-3-carbaldehyde (20.69 g, 0.05 mol), p-toluenesulfonic acid monohydrate (9.52 g, 0.05 mol), and 1,4-dioxane (115.7 g) were put in a 500 ml flask equipped with a thermometer, a condenser, and a mechanical stirrer and stirred at 120° C. When a specimen taken from the polymerization reactant by every one hour had a weight average molecular weight in a range of 2,000 to 3,000, the reaction was considered as completed. When the reaction was complete, tetrahydrofuran and ethylacetate were added thereto, and the mixture was treated three times repetitively with distilled water to remove the acid catalyst. Then, ethylacetate was added to extract an organic layer, and the organic layer was extracted under a reduced pressure. Subsequently, 30 g of tetrahydrofuran was added thereto, the mixture was precipitated with 200 g of hexane, and 1,4-dioxane and monomers remaining in the mixture were removed, obtaining a polymer represented by Chemical Formula 1e (Mw: 2000).

[Chemical Formula 1e]

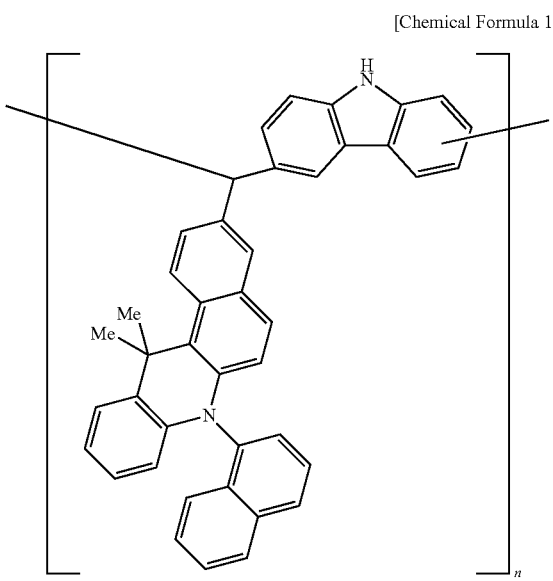

Comparative Synthesis Example 1

Hydroxypyrene (21.84 g, 0.1 mol), anthracene-9-carbaldehyde (20.64 g, 0.1 mol), p-toluenesulfonic acid monohydrate (19.04 g, 0.1 mol), and 1,4-dioxane (184.6 g) were put in a 500 ml flask equipped with a thermometer, a condenser, and a mechanical stirrer and stirred at 120° C. When a specimen taken from the polymerization reactant by every one hour had a weight average molecular weight in a range of 2,000 to 3,000, the reaction was considered as completed. When the reaction was complete, tetrahydrofuran and ethylacetate were added thereto, and the mixture was treated three times repetitively with distilled water to remove the acid catalyst. Then, ethylacetate was added to extract an organic layer, and the organic layer was extracted under a reduced pressure. Subsequently, 50 g of tetrahydrofuran was added thereto, the mixture was precipitated with 300 g of hexane, and 1,4-dioxane and monomers remaining in the mixture were removed, obtaining a polymer represented by Chemical Formula A (Mw: 2480).

[Chemical Formula A]

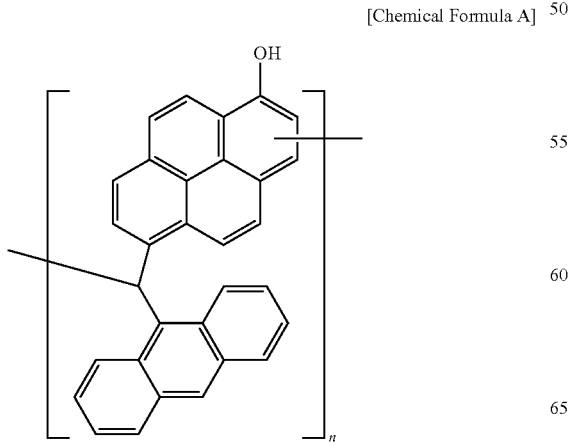

Comparative Synthesis Example 2

5,11-dihydroindolo[3,2-b]carbazole (25.65 g, 0.1 mol), anthracene-9-carbaldehyde (20.64 g, 0.1 mol), p-toluenesulfonic acid monohydrate (19.04 g, 0.1 mol), and 1,4-dioxane (196 g) were put in a 500 ml flask equipped with a thermometer, a condenser, and a mechanical stirrer and stirred at 120° C. When a specimen taken from the polymerization reactant by every one hour had a weight average molecular weight in a range of 2,000 to 3,000, the reaction was considered as completed. When the reaction was complete, tetrahydrofuran and ethylacetate were added thereto, and the mixture was treated three times repetitively with distilled water to remove the acid catalyst. Then, ethylacetate was added to extract an organic layer, and the organic layer was extracted under a reduced pressure. Subsequently, 50 g of tetrahydrofuran was added thereto, the mixture was precipitated with 300 g of hexane, and 1,4-dioxane and monomers remaining in the mixture were removed, obtaining a polymer represented by Chemical Formula B (Mw: 2180).

[Chemical Formula B]

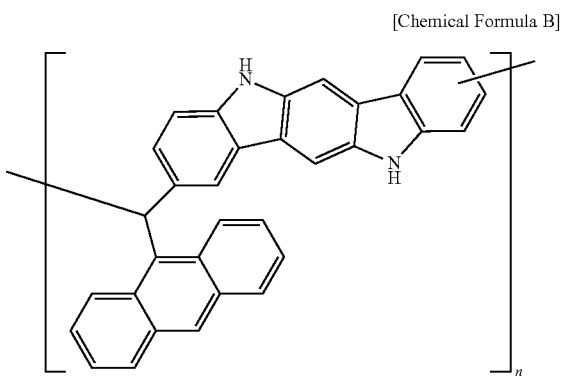

Comparative Synthesis Example 3

2-naphthol (14.43 g, 0.1 mol), perylene-1-carbaldehyde (28.06 g, 0.1 mol), p-toluenesulfonic acid monohydrate (19.04 g, 0.1 mol), and 1,4-dioxane (184.57 g) were put in a 500 ml flask equipped with a thermometer, a condenser, and a mechanical stirrer and stirred at 120° C. When a specimen taken from the polymerization reactant by every one hour had a weight average molecular weight in a range of 2,000 to 3,000, a reaction was considered as completed. When the reaction was complete, tetrahydrofuran and ethylacetate were added thereto, and the mixture was treated three times repetitively with distilled water to remove the acid catalyst. Then, ethylacetate was added to extract an organic layer, and the organic layer was extracted under a reduced pressure. Subsequently, 50 g of tetrahydrofuran was added thereto, the mixture was precipitated with 300 g of hexane, and 1,4-dioxane and monomers remaining in the mixture were removed, obtaining a polymer represented by Chemical Formula C (Mw: 2810).

[Chemical Formula C]

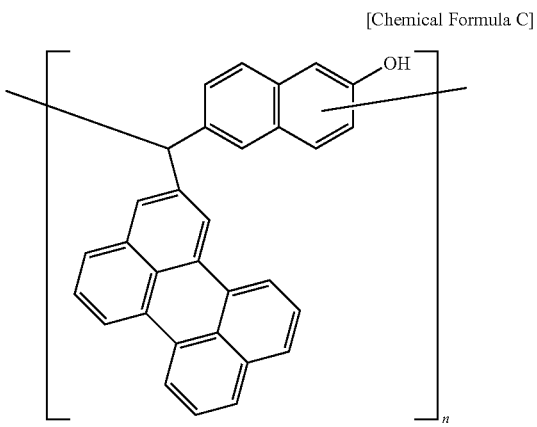

Comparative Synthesis Example 4

7H-benzo[g]naphtho[2,1-b]carbazole (15.88 g, 0.05 mol), pyrene-1-carbaldehyde (11.52 g, 0.05 mol), p-toluenesulfonic acid monohydrate (9.52 g, 0.05 mol), and 1,4-dioxane (110.77 g) were put in a 500 ml flask equipped with a thermometer, a condenser, and a mechanical stirrer and stirred at 120° C. When a specimen taken from the polymerization reactant by every one hour had a weight average molecular weight in a range of 2,000 to 3,000, the reaction was considered as completed. When the reaction was complete, tetrahydrofuran and ethylacetate were added thereto, and the mixture was treated three times repetitively with distilled water to remove the acid catalyst. Then, ethylacetate was added to extract an organic layer, and the organic layer was extracted under a reduced pressure. Subsequently, 30 g of tetrahydrofuran was added thereto, the mixture was precipitated with 200 g of hexane, and 1,4-dioxane and monomers remaining in the mixture were removed, obtaining a polymer represented by Chemical Formula D (Mw: 2220).

[Chemical Formula D]

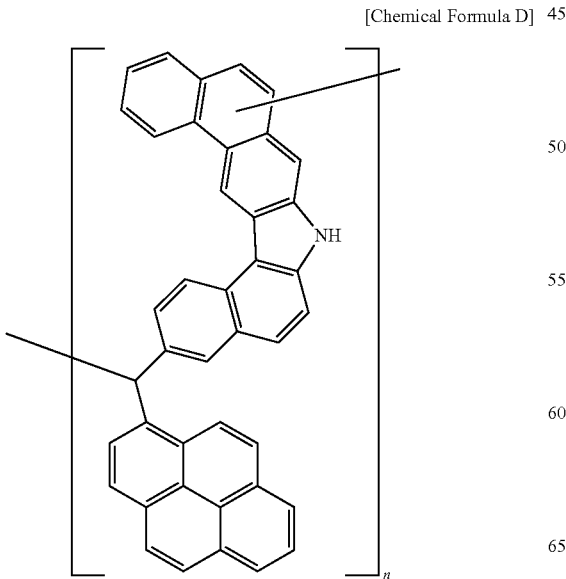

Comparative Synthesis Example 5

Carbazole (8.37 g, 0.05 mol), perylene-3-carbaldehyde (14.03 g, 0.05 mol), p-toluenesulfonic acid monohydrate (9.52 g, 0.05 mol), and 1,4-dioxane (95.74 g) were put in a 500 ml flask equipped with a thermometer, a condenser, and a mechanical stirrer and stirred at 120° C. When a specimen taken from the polymerization reactant by every one hour had a weight average molecular weight in a range of 2,000 to 3,000, a reaction was considered as completed. When the reaction was complete, tetrahydrofuran and ethylacetate were added thereto, and the mixture was treated three times repetitively with distilled water to remove the acid catalyst. Then, ethylacetate was added to extract an organic layer, and the organic layer was extracted under a reduced pressure. Subsequently, 30 g of tetrahydrofuran was added thereto, the mixture was precipitated with 200 g of hexane, and 1,4-dioxane and monomers remaining in the mixture were removed, obtaining a polymer represented by Chemical Formula E (Mw: 2190).

[Chemical Formula E]

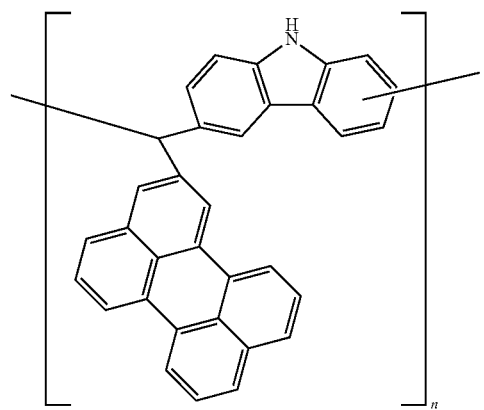

Preparation of Hardmask Composition

Example 1

The polymer according to Synthesis Example 1 was dissolved in a mixed solvent of propylene glycol monomethylether acetate (PGMEA) and cyclohexanone (7:3 (v/v)), and the solution was filtered, obtaining a hardmask composition. The resin was adjusted to have a weight in a range of 1.0 wt % to 15.0 wt % based on the total weight of the hardmask composition depending on a desired thickness.

Example 2

A hardmask composition was prepared according to the same method as Example 1 except for using the polymer according to Synthesis Example 2 instead of the polymer according to Synthesis Example 1.

Example 3

A hardmask composition was prepared according to the same method as Example 1 except for using the polymer according to Synthesis Example 3 instead of the polymer according to Synthesis Example 1.

Example 4

A hardmask composition was prepared according to the same method as Example 1 except for using the polymer according to Synthesis Example 4 instead of the polymer according to Synthesis Example 1.

Example 5

A hardmask composition was prepared according to the same method as Example 1 except for using the polymer according to Synthesis Example 5 instead of the polymer according to Synthesis Example 1.

Comparative Example 1

A hardmask composition was prepared according to the same method as Example 1 except for using the polymer according to Comparative Synthesis Example 1 instead of the polymer according to Synthesis Example 1.

Comparative Example 2

A hardmask composition was prepared according to the same method as Example 1 except for using the polymer according to Comparative Synthesis Example 2 instead of the polymer according to Synthesis Example 1.

Comparative Example 3

A hardmask composition was prepared according to the same method as Example 1 except for using the polymer according to Comparative Synthesis Example 3 instead of the polymer according to Synthesis Example 1.

Comparative Example 4

A hardmask composition was prepared according to the same method as Example 1 except for using the polymer according to Comparative Synthesis Example 4 instead of the polymer according to Synthesis Example 1.

Comparative Example 5

A hardmask composition was prepared according to the same method as Example 1 except for using the polymer according to Comparative Synthesis Example 5 instead of the polymer according to Synthesis Example 1.

Evaluation 1: Etch Resistance

Each hardmask composition according to Examples 1 to 5 and Comparative Examples 1 to 5 was spin-on coated to be 4,000 Å thick on a silicon wafer and heat-treated on a hot plate at 400° C. for 2 minutes to form a thin film. The thickness of the thin film was measured.

Subsequently, the thin film was dry-etched with $N_2/O_2$ mixed gas for 60 seconds, and the thickness of the thin film was measured again. The thicknesses of the thin film before and after the dry etching and the etching time of the thin film were used to calculate its bulk etch rate (BER) according to Calculation Equation 1.

Bulk etch rate (BER)=(Initial thin film thickness−Thin film thickness after etching)/etching time (Å/sec)                                       [Calculation Equation 1]

The results are provided in Table 1.

TABLE 1

| | Bulk etch rate (Å/sec) ($N_2/O_2$ mixed gas) |
|---|---|
| Example 1 | 20.18 |
| Example 2 | 19.85 |
| Example 3 | 22.06 |
| Example 4 | 20.27 |
| Example 5 | 21.33 |
| Comparative Example 1 | 22.49 |
| Comparative Example 2 | 25.42 |
| Comparative Example 3 | 24.37 |
| Comparative Example 4 | 23.56 |
| Comparative Example 5 | 24.8 |

Referring to Table 1, the thin films respectively formed of the hardmask compositions according to Examples 1 to 5 showed a lower etch rate than that of the thin films respectively formed of the hardmask compositions according to Comparative Examples 1 to 5.

Accordingly, the thin films respectively formed of the hardmask compositions according to Examples 1 to 5 showed a higher etch resistance than that of the thin films respectively formed of the hardmask compositions according to Comparative Examples 1 to 5. (That is, in Table 1, a lower etch rate is more desirable.)

Evaluation 2: Gap-Fill and Planarization Characteristics

Each hardmask composition according to Examples 1 to 5 and Comparative Examples 1 to 5 was spin-on coated onto a patterned silicon wafer and heat-treated at 400° C. for 120 seconds. The gap-fill and planarization characteristics of each hardmask composition were measured by using V-SEM equipment. The hardmask compositions according to Examples 1 to 5 and Comparative Examples 1 to 5 were adjusted regarding a solid content to have a thickness of 1,700 Å on the bare wafer.

Gap-fill characteristics were evaluated by examining with an electron scanning microscope (SEM) to determine whether the cross section of a pattern had a void. Planarization characteristics were evaluated by measuring the thickness of a hardmask layer from the SEM image according to the cross-section of the pattern and using the measurements according to Calculation Equation 2 shown in FIG. 1. Herein, the planarization characteristics are more excellent when h1 and h2 have a smaller difference. Accordingly, in Table 2, below, a smaller result indicates more excellent planarization characteristics.

The results are provided in Table 2.

TABLE 2

| | Planarization characteristics | | Gap-fill characteristics |
|---|---|---|---|
| | Aspect ratio (1:2) | Aspect ratio (1:15) | (aspect ratio (1:5)) |
| Example 1 | 4.28 | 66.43 | No void |
| Example 2 | 5.15 | 74.32 | No void |
| Example 3 | 5.73 | 76.55 | No void |
| Example 4 | 4.64 | 70.70 | No void |
| Example 5 | 6.68 | 78.11 | No void |
| Comparative Example 1 | 10.61 | 89.44 | Void |
| Comparative Example 2 | 10.87 | 88.18 | No void |
| Comparative Example 3 | 11.51 | 90.65 | Void |
| Comparative Example 4 | 12.47 | 93.28 | Void |
| Comparative Example 5 | 14.06 | 98.83 | Void |

Referring to Table 2, the hardmask compositions according to Examples 1 to 5 showed excellent planarization characteristics compared with the hardmask compositions according to Comparative Examples 1 to 5 and also showed excellent gap-fill characteristics since no void was observed, even under the condition of a deep pattern (an aspect ratio=1:5).

By way of summation and review, in a patterning process, an organic layer referred to as a hardmask layer may be formed as a hard interlayer to transfer a fine pattern of the photoresist down to a sufficient depth on a substrate without a collapse. The hardmask layer plays a role of an interlayer transferring the fine pattern of the photoresist to a material layer through a selective etching process. Accordingly, it is desirable for a hardmask layer to have characteristics such as etch resistance, or the like to endure multi-etching processes. A spin-on coating method instead of a chemical vapor deposition (CVD) method has recently been suggested to form the hardmask layer. In general, heat resistance and etch resistance have a trade-off relationship with spin-on characteristics. Accordingly, an organic layer material satisfying all the characteristics is desirable Embodiments provide a polymer having good solubility characteristics as well as excellent etch resistance. Due to the good solubility characteristics, the polymer may be applied using spin coating.

Embodiments further provide an organic layer including the polymer. The organic layer may satisfy mechanical characteristics and provide film flatness simultaneously.

Embodiment further provide a method of forming a pattern using the organic layer composition.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:
1. A polymer, comprising:
a first moiety represented by Chemical Formula 1, and
a second moiety including a substituted or unsubstituted C6 to C60 cyclic group, a substituted or unsubstituted C6 to C60 hetero cyclic group, or a combination thereof:

[Chemical Formula 1]

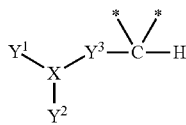

wherein, in Chemical Formula 1,
the *s are linking points of C in a main chain of the polymer,
$Y^3$—X—$Y^1Y^2$ together form a pendant group from C,
X is phosphorus (P), nitrogen (N), boron (B), or P=O, $Y^1$ and $Y^2$ are independently hydrogen or a moiety including at least one substituted or unsubstituted benzene ring, provided that at least one of $Y^1$ and $Y^2$ is the moiety including at least one substituted or unsubstituted benzene ring, and $Y^3$ is another moiety including at least one substituted or unsubstituted benzene ring, and wherein linking points of the second moiety in the main chain of the polymer extend from ring carbons of the second moiety, wherein the first moiety and the second moiety are linked to form a subunit such that the polymer is represented by one of Chemical Formulae 2 to 6:

[Chemical Formula 2]

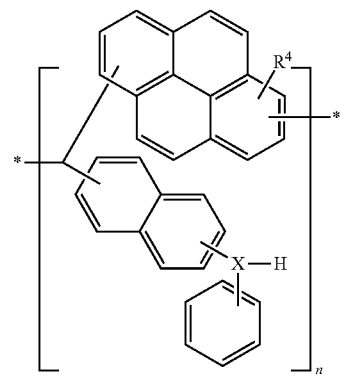

[Chemical Formula 3]

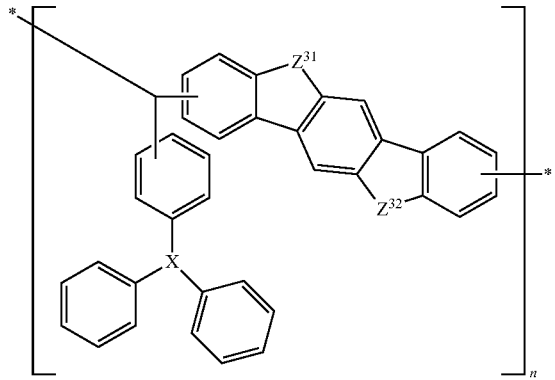

[Chemical Formula 4]

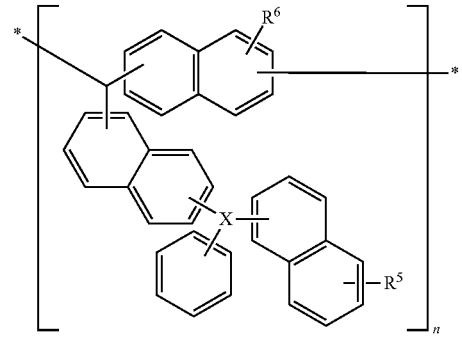

-continued

[Chemical Formula 5]

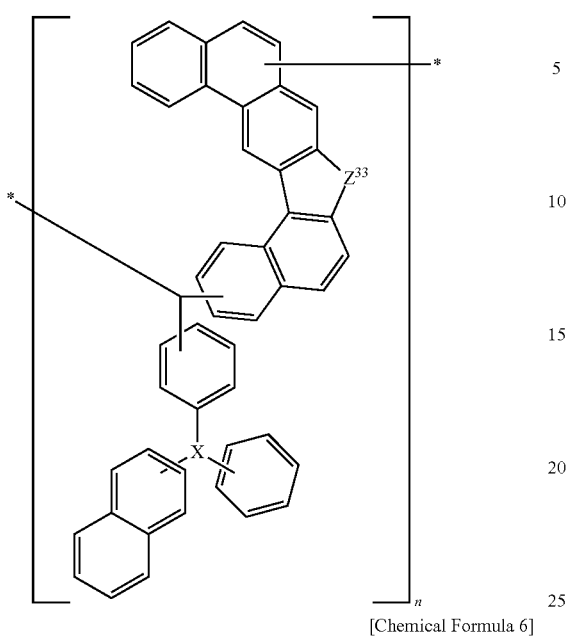

[Chemical Formula 6]

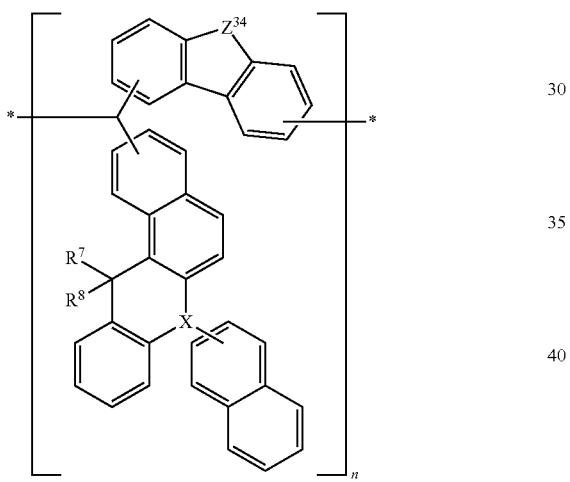

wherein, in Chemical Formulae 2 to 6,
the *s are linking points of the subunit in the main chain of the polymer,
X is phosphorus (P), nitrogen (N), boron (B), or P=O,
$Z^{31}$ to $Z^{34}$ are independently C=O, oxygen (O), sulfur (S), $CR^bR^c$, $NR^d$, or a combination thereof, wherein $R^b$ to $R^d$ are independently hydrogen, a substituted or unsubstituted C1 to C10 alkyl group, a halogen atom, or a combination thereof,
$R^4$ to $R^8$ are independently a hydroxy group, a thionyl group, a thiol group, a cyano group, a substituted or unsubstituted amino group, a halogen atom, a substituted or unsubstituted C1 to C30 alkyl group, a substituted or unsubstituted C1 to C30 alkoxy group, or a combination thereof, and
n is an integer ranging from 2 to 200.

2. An organic layer composition comprising:
a polymer that includes:
  a first moiety represented by Chemical Formula 1, and
  a second moiety including a substituted or unsubstituted C6 to C60 cyclic group, a substituted or unsubstituted C6 to C60 hetero cyclic group, or a combination thereof:

[Chemical Formula 1]

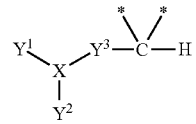

wherein, in Chemical Formula 1,
the *s are linking points of C in a main chain of the polymer,
$Y^3$—X—$Y^1Y^2$ together form a pendant group from C,
X is phosphorus (P), nitrogen (N), boron (B), or P=O,
$Y^1$ and $Y^2$ are independently hydrogen or a moiety including at least one substituted or unsubstituted benzene ring, provided that at least one of $Y^1$ and $Y^2$ is the moiety including at least one substituted or unsubstituted benzene ring, and
$Y^3$ is another moiety including at least one substituted or unsubstituted benzene ring, and
wherein linking points of the second moiety in the main chain of the polymer extend from ring carbons of the second moiety; and
a solvent,
wherein the first moiety and the second moiety are linked to form a subunit such that the polymer is represented by one of Chemical Formulae 2 to 6:

[Chemical Formula 2]

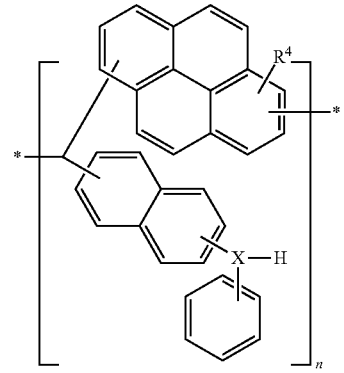

[Chemical Formula 3]

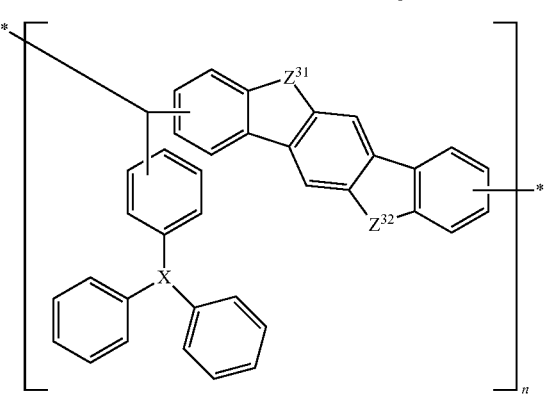

-continued

[Chemical Formula 4]

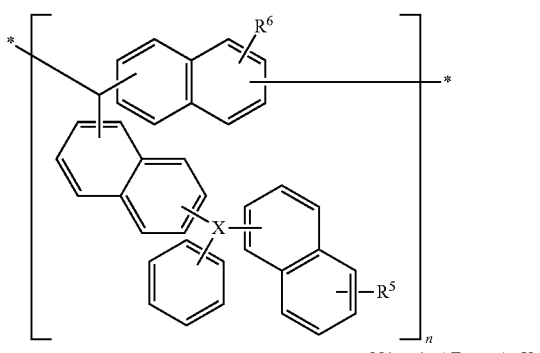

[Chemical Formula 5]

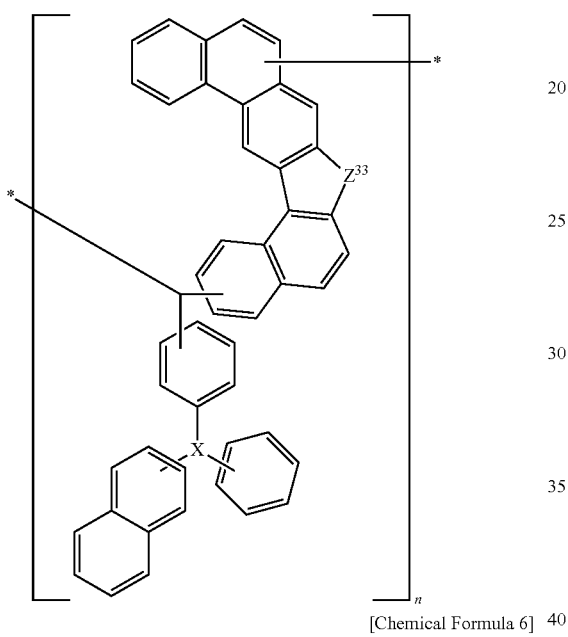

[Chemical Formula 6]

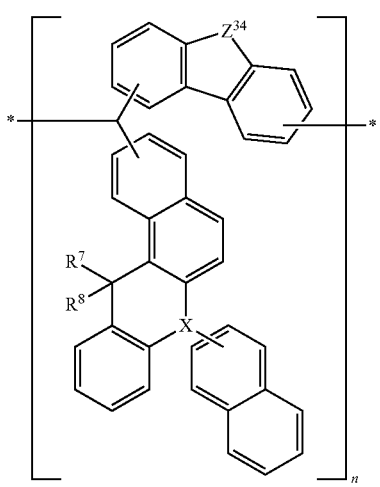

wherein, in Chemical Formulae 2 to 6,
the *s are linking points of the subunit in the main chain of the polymer,
X is phosphorus (P), nitrogen (N), boron (B), or P=O,
$Z^{31}$ to $Z^{34}$ are independently C=O, oxygen (O), sulfur (S), $CR^bR^c$, $NR^d$, or a combination thereof, wherein $R^b$ to $R^d$ are independently hydrogen, a substituted or unsubstituted C1 to C10 alkyl group, a halogen atom, or a combination thereof,
$R^4$ to $R^8$ are independently a hydroxy group, a thionyl group, a thiol group, a cyano group, a substituted or unsubstituted amino group, a halogen atom, a substituted or unsubstituted C1 to C30 alkyl group, a substituted or unsubstituted C1 to C30 alkoxy group, or a combination thereof, and
n is an integer ranging from 2 to 200.

3. A method of forming a pattern, the method comprising providing a material layer on a substrate,
applying an organic layer composition on the material layer,
heat-treating the organic layer composition to provide a hardmask layer,
providing a silicon-containing thin layer on the hardmask layer,
providing a photoresist layer on the silicon-containing thin layer,
exposing and developing the photoresist layer to form a photoresist pattern,
selectively removing the silicon-containing thin layer and the hardmask layer using the photoresist pattern to expose a part of the material layer, and
etching an exposed part of the material layer to form the pattern, wherein:
the organic layer composition includes:
a polymer that includes:
a first moiety represented by Chemical Formula 1, and
a second moiety including a substituted or unsubstituted C6 to C60 cyclic group, a substituted or unsubstituted C6 to C60 hetero cyclic group, or a combination thereof:

[Chemical Formula 1]

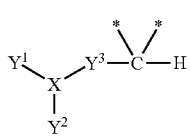

wherein, in Chemical Formula 1,
the *s are linking points of C in a main chain of the polymer,
$Y^3$—X—$Y^1Y^2$ together form a pendant group from C,
X is phosphorus (P), nitrogen (N), boron (B), or P=O,
$Y^1$ and $Y^2$ are independently hydrogen or a moiety including at least one substituted or unsubstituted benzene ring, provided that at least one of $Y^1$ and $Y^2$ is the moiety including at least one substituted or unsubstituted benzene ring, and
$Y^3$ is another moiety including at least one substituted or unsubstituted benzene ring, and
wherein linking points of the second moiety in the main chain of the polymer extend from ring carbons of the second moiety; and
a solvent.

4. The method as claimed in claim 3, wherein the organic layer composition is applied using a spin-on coating method.

5. The method as claimed in claim 3, which further comprises providing a bottom antireflective coating (BARC) before providing the photoresist layer.

* * * * *